US012796332B2

(12) United States Patent
Tsuda

(10) Patent No.: US 12,796,332 B2
(45) Date of Patent: Nov. 10, 2026

(54) PIEZOELECTRIC THIN FILM RESONATOR AND METHOD OF MANUFACTURING THE SAME

(71) Applicant: TAIYO YUDEN CO., LTD., Tokyo (JP)

(72) Inventor: Yuta Tsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1021 days.

(21) Appl. No.: 17/987,216

(22) Filed: Nov. 15, 2022

(65) Prior Publication Data

US 2023/0172071 A1 Jun. 1, 2023

(30) Foreign Application Priority Data

Nov. 29, 2021 (JP) ................................ 2021-192903

(51) Int. Cl.

| | |
|---|---|
| ***H10N 30/00*** | (2023.01) |
| ***H03H 9/54*** | (2006.01) |
| ***H10N 30/01*** | (2023.01) |
| ***H10N 30/853*** | (2023.01) |
| ***H10N 30/87*** | (2023.01) |

(52) U.S. Cl.

CPC ............ *H10N 30/877* (2023.02); *H03H 9/54* (2013.01); *H10N 30/01* (2023.02); *H10N 30/853* (2023.02)

(58) Field of Classification Search

CPC .... H10N 30/877; H10N 30/01; H10N 30/853; H03H 9/54; H03H 2003/025; H03H 3/02; H03H 9/175

See application file for complete search history.

(56) References Cited

U.S. PATENT DOCUMENTS

2002/0084873 A1* 7/2002 Ella ........................ H03H 9/564 333/191
2019/0149129 A1 5/2019 Ueda

FOREIGN PATENT DOCUMENTS

JP 2002-251190 A 9/2002
JP 2008113401 A * 5/2008

(Continued)

OTHER PUBLICATIONS

Japanese Office Action dated Jun. 17, 2025 in a counterpart Japanese patent application No. 2021-192903. (A machine translation (not reviewed for accuracy) attached.).

*Primary Examiner* — Julio C. Gonzalez

(74) *Attorney, Agent, or Firm* — CHEN YOSHIMURA LLP

(57) ABSTRACT

A piezoelectric thin film resonator includes a substrate, a lower electrode provided over the substrate, a piezoelectric layer provided on the lower electrode, an upper electrode provided on the piezoelectric layer, the lower electrode and the upper electrode sandwiching at least a part of the piezoelectric layer therebetween to form a resonance region, and an acoustic mirror provided between the substrate and the lower electrode, the acoustic mirror including one or more first layers and second layers that are alternately stacked, each of the one or more first layers having an end face inclined such that a first surface at the lower electrode side is larger than a second surface at the substrate side and having an edge positioned outside the resonance region in a plan view, the second layers being made of a material different from a material of the one or more first layers.

8 Claims, 17 Drawing Sheets

(56) References Cited

FOREIGN PATENT DOCUMENTS

| | | | | |
|---|---|---|---|---|
| JP | 2009-022052 | A | | 1/2009 |
| JP | 2019-092096 | A | | 6/2019 |
| JP | 2020-205574 | A | | 12/2020 |
| JP | 2021118477 | A | * | 8/2021 |

* cited by examiner

SAMPLE A2

SAMPLE B2

SAMPLE A3

SAMPLE B3

PIEZOELECTRIC THIN FILM RESONATOR AND METHOD OF MANUFACTURING THE SAME

FIELD

A certain aspect of the present disclosure relates to a piezoelectric thin film resonator and a method of manufacturing the same.

BACKGROUND

Bulk acoustic wave (BAW) resonators such as solid mounted resonators (SMRs) are used as filters and duplexers for high-frequency circuits of wireless terminals such as mobile phones. The BAW resonator is called a piezoelectric thin film resonator. The piezoelectric thin film resonator has a structure in which a lower electrode and an upper electrode are provided with a piezoelectric layer interposed therebetween, and a resonance region where the lower electrode and the upper electrode are opposite to each other across at least a part of the piezoelectric layer is a region where an acoustic wave resonates. It is known to stack a first layer and a second layer having different acoustic impedances as an acoustic mirror, which reflects the acoustic wave, under the lower electrode as disclosed in, for example, Japanese Patent Application Laid-Open Nos. 2009-22052, 2019-092096, and 2020-205574 (Patent Documents 1 to 3).

Related Art Documents

Patent Documents

Japanese Patent Application Laid-Open No. 2009-22052
Japanese Patent Application Laid-Open No. 2019-092096
Japanese Patent Application Laid-Open No. 2020-205574

SUMMARY

In Patent Document 1, the end face of the first layer having a larger acoustic impedance in the acoustic mirror is inclined in a forward tapered shape. The inclination of the end face of the first layer inhibits formation of voids in the second layer in the vicinity of the end face of the first layer. In addition, the adhesion between the first layer and the second layer is improved. However, the end face of the first layer may be inclined in an inverse tapered shape. For example, when the first layer and the second layer are stacked on the lower surface of the piezoelectric layer as disclosed in Patent Document 2, the end face of the first layer has an inverse tapered shape. When the end face of the first layer has an inverse tapered shape, the characteristics of the piezoelectric thin film resonator may be deteriorated.

An object of the present disclosure is to reduce deterioration in characteristics.

According to an aspect of the present disclosure, there is provided a piezoelectric thin film resonator including: a substrate; a lower electrode provided over the substrate; a piezoelectric layer provided on the lower electrode; an upper electrode provided on the piezoelectric layer, the lower electrode and the upper electrode sandwiching at least a part of the piezoelectric layer therebetween to form a resonance region; and an acoustic mirror provided between the substrate and the lower electrode, the acoustic mirror including one or more first layers and a plurality of second layers that are alternately stacked, each of the one or more first layers having an end face inclined such that a first surface, at a side of the lower electrode, of the first layer is larger than a second surface, at a side of the substrate, of the first layer and having an edge positioned outside the resonance region in a plan view, the second layers being made of a material different from a material of the one or more first layers.

In the above piezoelectric thin film resonator, when a cross section is observed, a position at which the end face and the second surface are in contact with each other in each of the one or more first layers may be substantially aligned with an edge of the resonance region or is located outside the resonance region.

In the above piezoelectric thin film resonator, a distance between the edge of each of the one or more first layers and an edge of the resonance region may be equal to or greater than a thickness of the corresponding first layer.

According to another aspect of the present disclosure, there is provided a piezoelectric thin film resonator including: a substrate; a lower electrode provided over the substrate; a piezoelectric layer provided on the lower electrode; an upper electrode provided on the piezoelectric layer, the lower electrode and the upper electrode sandwiching at least a part of the piezoelectric layer therebetween to form a resonance region; and an acoustic mirror provided between the substrate and the lower electrode, the acoustic mirror including one or more first layers and a plurality of second layers that are alternately stacked, an end face of each of the one or more first layers being inclined such that a first surface, at a side of the lower electrode, of the first layer is larger than a second surface, at a side of the substrate, of the first layer, an angle between the end face and the first surface being 45° or greater, an edge of each of the one or more first layers being substantially aligned with an edge of the resonance region or being located within the resonance region, in a plan view, and the second layers being made of a material different from a material of the one or more first layers.

In the above piezoelectric thin film resonator, a distance between the end of each of the one or more first layers and an end of the resonance region in the plan view maybe equal to or less than a thickness of the corresponding first layer.

In the above piezoelectric thin film resonator, an acoustic impedance of each of the one or more first layers may be larger than an acoustic impedance of each of the second layers.

In the above piezoelectric thin film resonator, the resonance region may be provided in a plurality, and the piezoelectric layer may be a monocrystalline substrate, may be provided continuously across a plurality of the resonance regions, and may have a substantially flat surface at the acoustic mirror side.

According to another aspect of the present disclosure, there is provided a method of manufacturing a piezoelectric thin film resonator, the method including: forming an acoustic mirror, in which one or more first layers and a plurality of second layers are alternately stacked, on a first surface of a piezoelectric layer on which a lower electrode has been provided, an end face of each of the one or more first layers being inclined such that a first surface, at a side of the lower electrode, of the first layer is larger than a second surface of the first layer opposite to the first surface, the second layers being made of a material different from a material of the one or more first layers; bonding the acoustic mirror to a substrate; and forming an upper electrode on a second surface of the piezoelectric layer opposite to the first surface of the piezoelectric layer so that, in a plan view, an edge of each of the one or more first layers is located outside a resonance region where the lower electrode and the upper electrode are opposite to each other across at least a part of the piezoelectric layer.

According to another aspect of the present disclosure, there is provided a method of manufacturing a piezoelectric thin film resonator, the method including: forming an acoustic mirror, in which one or more first layers and a plurality of second layers are alternately stacked, on a first surface of a piezoelectric layer on which a lower electrode has been provided, an end face of each of the one or more first layers being inclined such that a first surface, at a side of the lower electrode, of the first layer is larger than a second surface of the first layer opposite to the first surface, an angle between the end face and the first surface of the first layer being 45° or greater; bonding the acoustic mirror to a substrate; and forming an upper electrode on a second surface of the piezoelectric layer opposite to the first surface of the piezoelectric layer so that, in a plan view, an edge of each of the one or more first layers is substantially aligned with an edge of a resonance region where the lower electrode and the upper electrode are opposite to each other across at least a part of the piezoelectric layer or is located within the resonance region.

In the above method, the forming of the acoustic mirror may include: forming one second layer of the second layers so that the one second layer overlaps at least a part of a region where the lower electrode is provided of the piezoelectric layer, forming one first layer of the one or more first layers on the one second layer, etching the one first layer to leave the one first layer in the resonance region and to incline an end face of the one first layer, and forming another second layer of the second layers on the one second layer and the one first layer.

DESCRIPTION OF EMBODIMENTS

Hereinafter, embodiments of the present disclosure will be described with reference to the accompanying drawings.

First Embodiment

Figure 1:
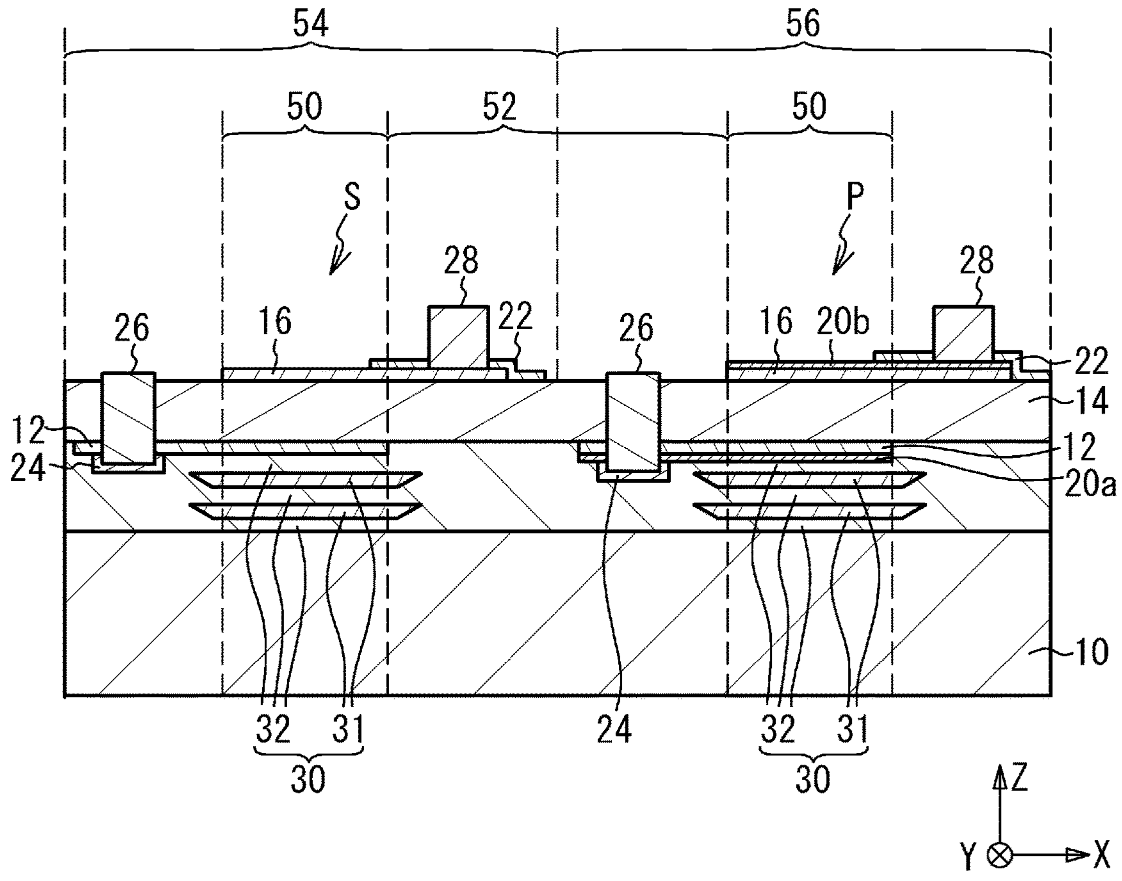
FIG. 1 is a cross-sectional view of a piezoelectric thin film resonator in accordance with a first embodiment.

FIG. 1 is a cross-sectional view of a piezoelectric thin film resonator in accordance with a first embodiment. A normal direction with respect to the surface of a piezoelectric layer 14 as viewed from the thickness direction is defined as a Z direction, a direction in which an upper electrode 16 is extracted among the planar directions of the piezoelectric layer 14 is defined as a +X direction, and a direction orthogonal to the X direction is defined as a Y direction.

The piezoelectric thin film resonator provided in a left region 54 is, for example, a series resonator S of a ladder-type filter, and the piezoelectric thin film resonator provided in a right region 56 is a parallel resonator P of the ladder-type filter.

As illustrated in FIG. 1, a lower electrode 12 is provided over a substrate 10. The piezoelectric layer 14 is provided on the lower electrode 12. The upper electrode 16 is provided on the piezoelectric layer 14. A resonance region 50 is defined by a region where the lower electrode 12 and the upper electrode 16 are opposite to each other across at least a part of the piezoelectric layer 14. In the parallel resonator P, additional films 20*a* and 20*b* are provided under the lower electrode 12 and on the upper electrode 16, respectively. Provision of the additional films 20*a* and 20*b* makes the resonant frequency of the parallel resonator P lower than the resonant frequency of the series resonator S. It is only required to provide either one of the additional films 20*a* and 20*b*.

An additional film 22 is provided on the upper electrode 16 in the peripheral region of the resonance region 50. The additional film 22 is provided to reduce spurious emissions. The additional film 22 may be provided in at least a part of the peripheral region of the resonance region 50, or may be omitted. When high-frequency power is applied between the lower electrode 12 and the upper electrode 16, an acoustic wave is excited in the piezoelectric layer 14 within the resonance region 50. The wavelength of the acoustic wave is approximately two times the sum of the thicknesses of the lower electrode 12, the piezoelectric layer 14, and the upper electrode 16. The interface between the substrate 10 and a second layer 32 is substantially flat, and the upper surface and the lower surface of the piezoelectric layer 14 are substantially flat.

An acoustic mirror 30 is provided in the resonance region 50 between the substrate 10 and the lower electrode 12. In the acoustic mirror 30, one or more first layers 31 and the second layers 32 made of a material different from that of the first layer 31 are alternately stacked. In the first embodiment, the acoustic impedance of the first layer 31 is higher than the acoustic impedance of the second layer 32. In a plan view, the acoustic mirror 30 overlaps the resonance region 50 and is larger than the resonance region 50. In a region 52 between the resonance regions 50, no first layer 31 is provided, and only the second layer 32 is provided. The number of the first layers 31 and the number of the second layers 32 can be set as appropriate.

A metal layer 24 is provided under the lower electrode 12 outside the resonance region 50. A metal layer 26 that penetrates through the piezoelectric layer 14 and is in contact with the metal layer 24 is provided. A metal layer 28 that is in contact with the upper electrode 16 outside the resonance region 50 is provided. The metal layers 26 and 28 function as pads for electrically connecting the lower electrode 12 and the upper electrode 16, respectively, to the outside and/or wiring lines for electrically connecting the lower electrode 12 and the upper electrode 16 to other piezoelectric thin film resonators.

Figure 2A:
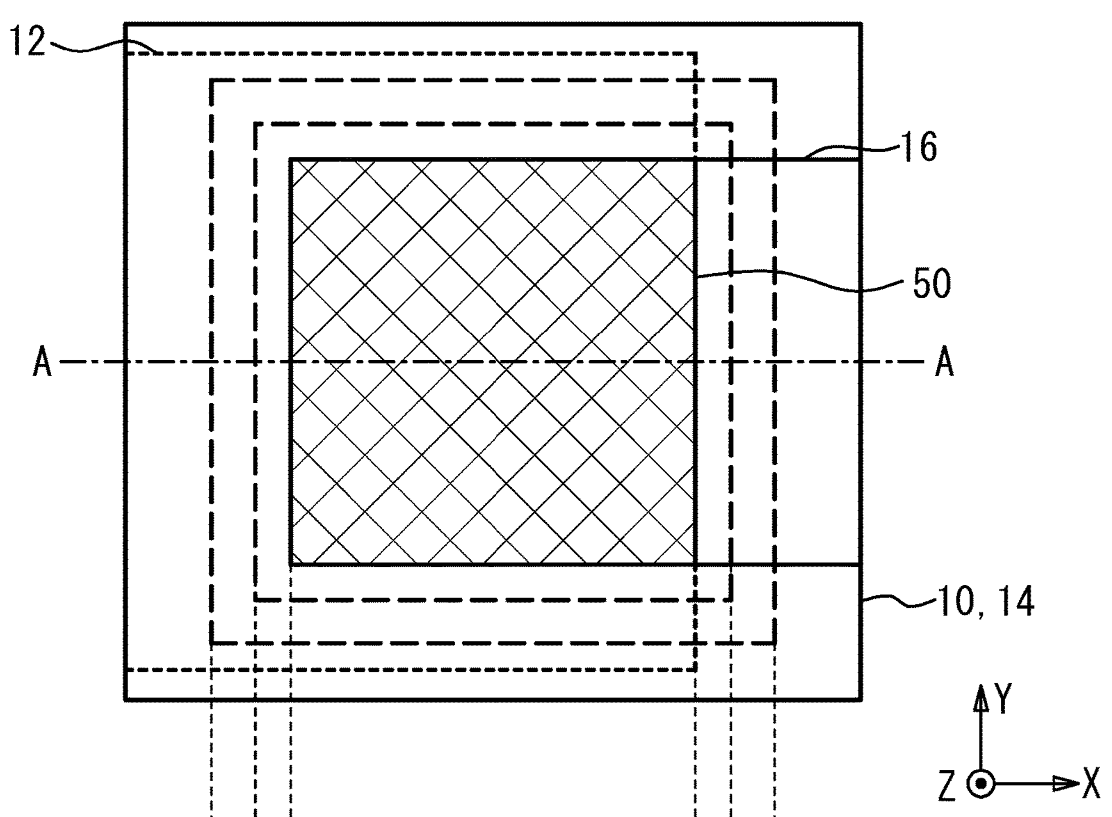
FIG. 2A is an enlarged plan view of the vicinity of a resonance region of the piezoelectric thin film resonator in accordance with the first embodiment.
Figure 2B:
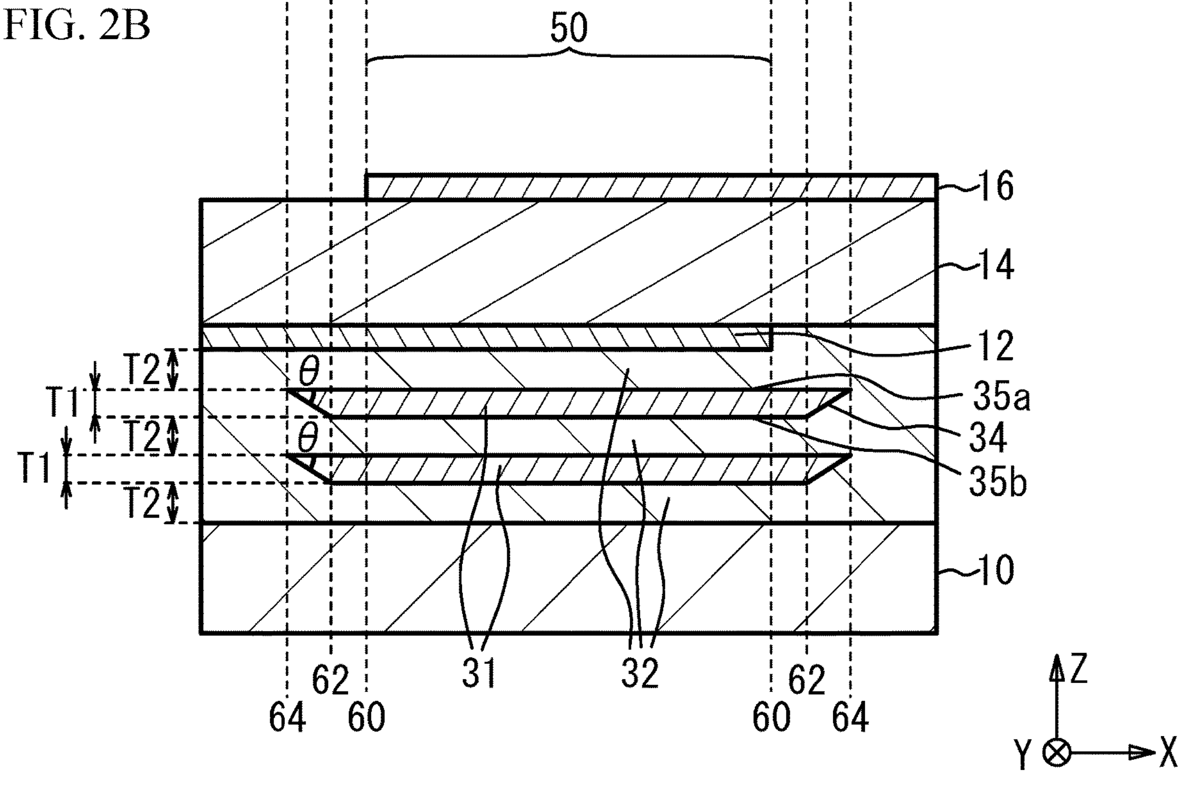
FIG. 2B is a cross-sectional view taken along line A-A in FIG. 2A.

FIG. 2A is an enlarged plan view of the vicinity of the resonance region of the piezoelectric thin film resonator in accordance with the first embodiment, and FIG. 2B is a cross-sectional view taken along line A-A in FIG. 2A. As illustrates in FIG. 2A and FIG. 2B, the sum T1+T2 of the thickness T1 of one first layer 31 and the thickness T2 of one second layer 32 is set to approximately ½ of the wave length of the acoustic wave. For example, the thickness T1 of one first layer 31 and the thickness T2 of one second layer 32 are each adjusted to be ¼ of the wave length of the acoustic wave. Thus, the acoustic wave excited in the piezoelectric layer 14 is reflected by the acoustic mirror 30.

An end face 34 of the first layer 31 is inclined with respect to the upper surface of the substrate 10 so that an upper surface 35*a* (a first surface at the lower electrode 12 side) of the first layer 31 is larger than a lower surface 35*b* (a second surface opposite to the first surface) of the first layer 31. That is, the end face 34 of the first layer 31 has an inverse tapered shape. The angle θ between the end face 34 of the first layer 31 and the upper surface 35*a* is, for example, 1° to 89°. The planar shape of the acoustic mirror 30 is larger than that of the resonance region 50. An edge (outer periphery) 64 of the first layer 31 (i.e., the edge of the upper surface 35*a* of the first layer 31) is located further out than an edge (outer periphery) 60 of the resonance region 50. A position 62 of the contact point between the end face 34 and the lower surface 35*b* is located further out than the edge 60 of the resonance region 50, or in the alternative, may be aligned with the edge 60 of the resonance region 50 to the extent of manufacturing errors.

The substrate 10 is, for example, a silicon substrate, and may be, for example, a sapphire substrate, an alumina substrate, a spinel substrate, a quartz substrate, a crystal substrate, a glass substrate, a ceramic substrate, or a gallium arsenide (GaAs) substrate. The piezoelectric layer 14 is, for example, monocrystalline lithium tantalate layer, a monocrystalline lithium niobate layer, or a monocrystalline quartz substrate. In the case that the piezoelectric layer 14 is made of monocrystalline lithium tantalate or a monocrystalline lithium niobate, an acoustic wave of thickness-shear vibration is excited in the piezoelectric layer 14. The piezoelectric layer 14 may be, for example, a polycrystalline aluminum nitride layer, a zinc oxide layer, a lead zirconate titanate (PZT) layer, or a lead titanate ($PbTiO_3$) layer. In this case, a thickness longitudinal vibration is excited in the piezoelectric layer 14.

Each of the lower electrode 12 and the upper electrode 16 is, for example, an aluminum (Al) film, and is, for example, a single-layer film of ruthenium (Ru), chromium (Cr), titanium (Ti), copper (Cu), molybdenum (Mo), tungsten (W), tantalum (Ta), platinum (Pt), rhodium (Rh), iridium (Ir), or a multilayer film thereof. The additional film 22 may be a metal film exemplified as the lower electrode 12 and the upper electrode 16 or an insulating film such as a silicon oxide film, a silicon nitride film, an aluminum oxide film, a tantalum oxide film, or a niobium oxide film.

The first layer 31 is formed of a material having a large acoustic impedance such as tungsten, tantalum, molybdenum, or ruthenium. The material having a large acoustic impedance has a high density and is, for example, a high-melting-point metal (for example, a metal having a melting point higher than the melting point of platinum). The second layer 32 is made of a material having a small acoustic impedance such as silicon oxide or silicon nitride. Materials having low acoustic impedance are mainly insulators. The metal layer 24 is a low-resistance layer such as an aluminum layer, a gold layer, or a copper layer. The metal layers 26 and 28 are, for example, low-resistance layers such as gold layers, copper layers, or aluminum layers. The metal layers 24, 26, and 28 may include an adhesion film such as a titanium film, a chromium film, or a nickel film that is in contact with the lower electrode 12 or the upper electrode 16.

An example in which an acoustic wave excited in the piezoelectric layer 14 causes thickness-shear vibration will be described. The piezoelectric layer 14 is a rotated Y-cut lithium niobate substrate. In this case, the normal direction (the Z direction) of the upper surface of the piezoelectric layer 14 is a direction in the Y-axis Z-axis plane of the crystal orientation. As a result, thickness-shear vibration occurs in the planar direction of the piezoelectric layer 14. When the X direction corresponds to the X-axis orientation in the crystal orientation, and the Z direction corresponds to the direction obtained by rotating the Z-axis orientation 105° in the Y-axis-Z-axis plane of the crystal orientation about the X-axis orientation from the Z-axis orientation to the Y-axis orientation, the direction of the thickness-shear vibration is the Y direction.

As another example, a case in which the piezoelectric layer 14 is an X-cut lithium tantalate substrate will be described. In this case, the normal direction (the Z direction) of the upper surface of the piezoelectric layer 14 is the X-axis orientation of the crystal orientations. As a result, thickness-shear vibration occurs in the planar direction of the piezoelectric layer 14. When the Y direction corresponds to the direction obtained by rotating the +Y axis orientation 42° in the Y-axis-Z-axis plane about the X-axis orientation from the +Y axis orientation to the −Z-axis orientation of the crystal orientations, the direction of the thickness-shear vibration is the Y direction.

For example, configurations to set the resonance frequency at 3.7 GHz are as follows. The piezoelectric layer 14 is a rotated Y-cut lithium niobate substrate having a thickness of 460 nm, and each of the lower electrode 12 and the upper electrode 16 is made of an aluminum layer having a thickness of 44 nm. The thickness of each of the lower electrode 12 and the upper electrode 16 is 1% to 20% of the thickness of the piezoelectric layer 14. The width of the resonance region 50 in the X direction is, for example, 10 μm to 500 μm.

Manufacturing Method of the First Embodiment

FIG. 3A to FIG. 8B are cross-sectional views illustrating a method of manufacturing the piezoelectric thin film resonator in accordance with the first embodiment. In FIG. 3A to FIG. 6A, the Z direction is the downward direction because FIG. 3A to FIG. 6A are views obtained by vertically reversing FIG. 1, while in FIG. 6B to FIG. 8B, the Z direction is the upward direction as in FIG. 1.

Figure 3A:
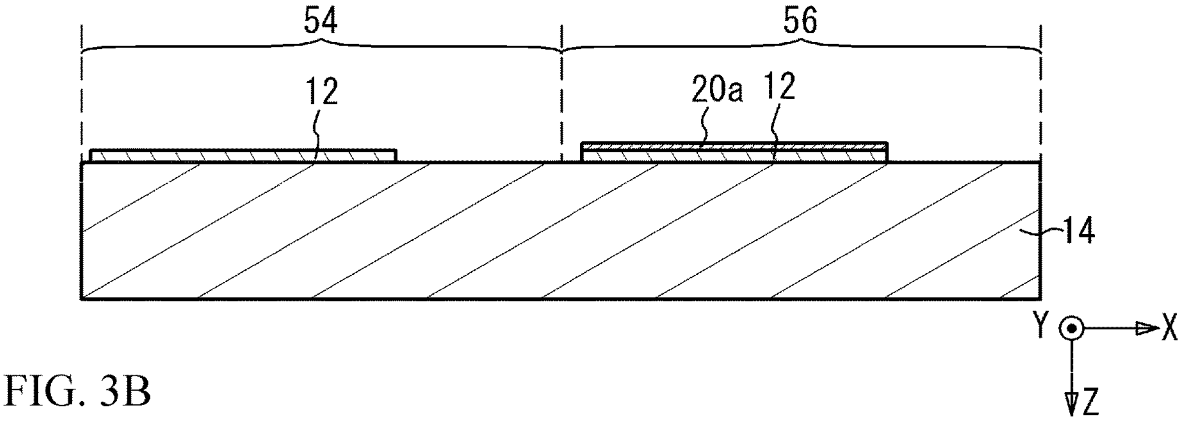
FIG. 3A to FIG. 3C are cross-sectional views (part 1) illustrating a method of manufacturing the piezoelectric thin film resonator in accordance with the first embodiment.

As illustrated in FIG. 3A, a piezoelectric substrate is prepared as the piezoelectric layer 14. The lower electrodes 12 are formed on the piezoelectric layer 14 in the regions 54 and 56, respectively. The additional film 20*a* is formed on the lower electrode 12 in the region 56. The additional film 20*a* is not formed on the lower electrode 12 in the region 54. The lower electrode 12 and the additional film 20*a* are formed by, for example, sputtering, vacuum evaporation, or chemical vapor deposition (CVD). The lower electrode 12 and the additional film 20*a* are patterned into desired shapes by photolithography and etching.

Figure 3B:
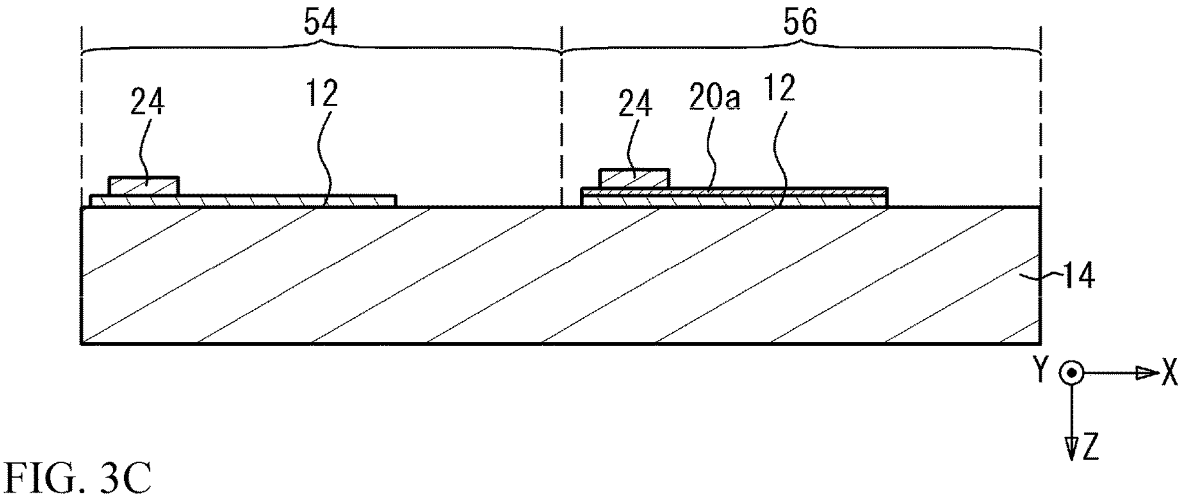

As illustrated in FIG. 3B, the metal layers 24 are formed on the lower electrode 12 in the region 54 and on the additional film 20*a* in the region 56, respectively. The metal layer 24 is formed by, for example, sputtering, vacuum evaporation, or CVD. The metal layers 24 are patterned into desired shapes by photolithography and etching.

Figure 3C:
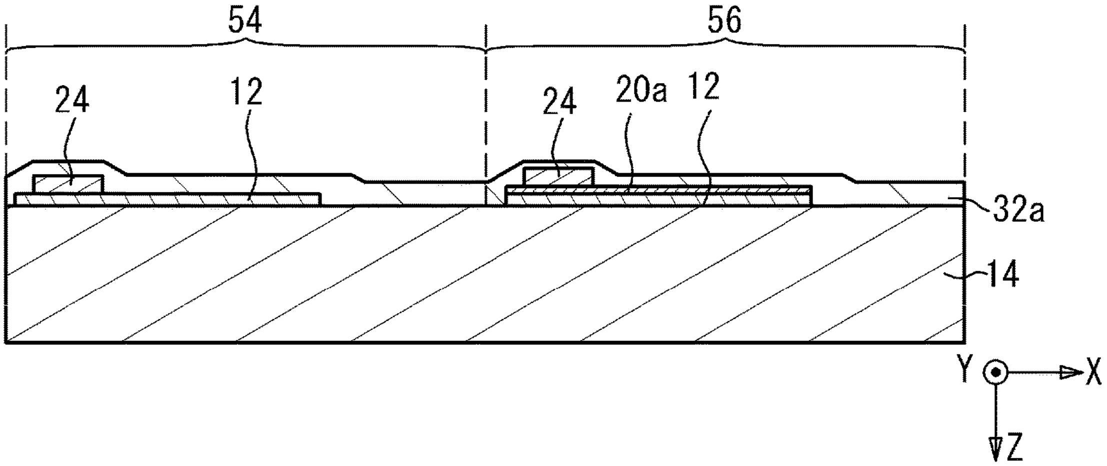

As illustrated in FIG. 3C, a second layer 32*a* is formed on the entire piezoelectric layer 14 so as to cover the lower electrodes 12, the additional film 20*a*, and the metal layer 24. The second layer 32*a* is formed by, for example, sputtering, vacuum evaporation, or CVD. In the case that the second layer 32*a* is made of a silicon oxide film or silicon nitride, the second layer 32*a* is formed by, for example, CVD.

Figure 4A:
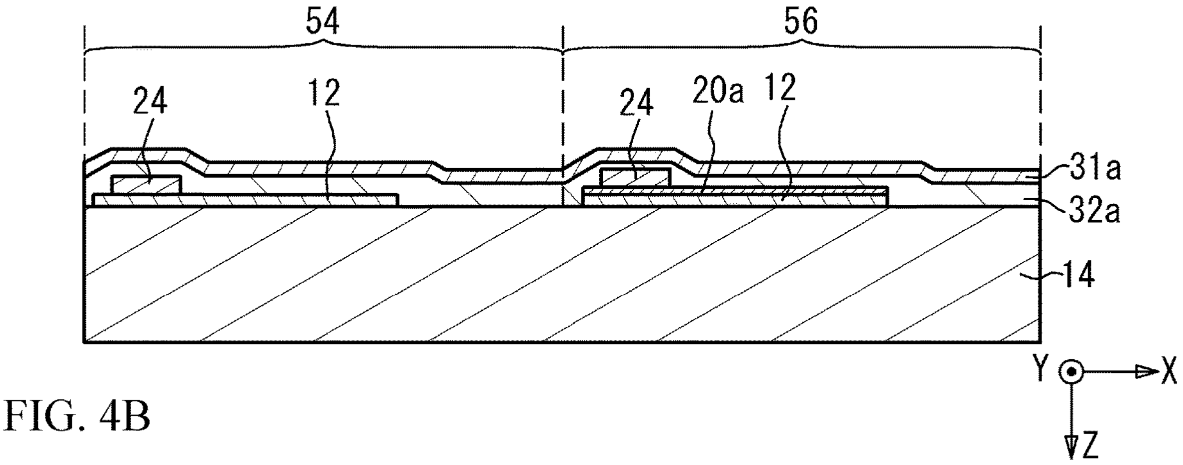
FIG. 4A to FIG. 4C are cross-sectional views (part 2) illustrating the method of manufacturing the piezoelectric thin film resonator in accordance with the first embodiment.

As illustrated in FIG. 4A, first layers 31*a* are formed on the second layer 32*a*. The first layers 31*a* are formed by, for example, sputtering, vacuum evaporation, or CVD. In the case that the first layer 31*a* is made of a high-melting-point metal such as tungsten, tantalum, molybdenum, or ruthenium, the first layer 31*a* is formed by, for example, sputtering.

Figure 4B:
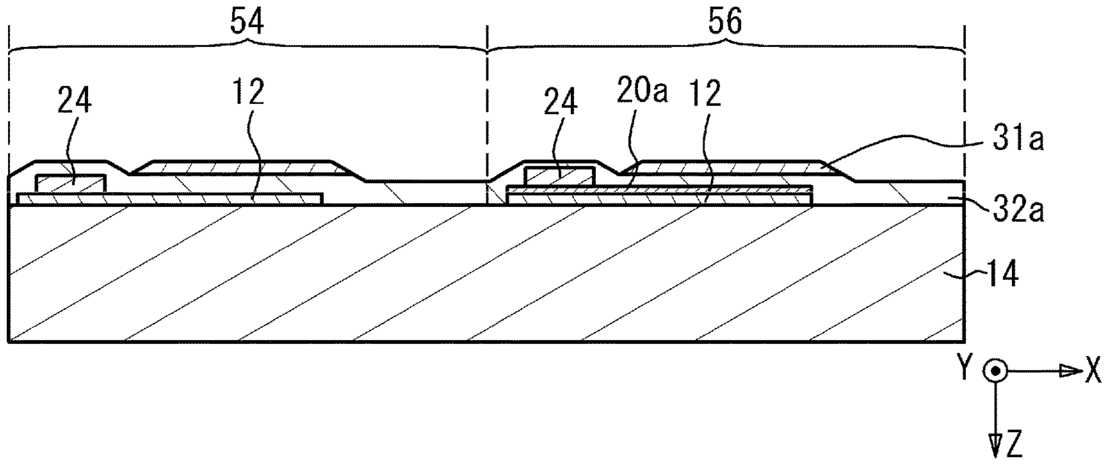

As illustrated in FIG. 4B, the first layers 31*a* are patterned into desired shapes by photolithography and etching. In the case that the first layer 31*a* is tungsten, the first layer 31*a* is etched by dry etching using, for example, a fluorine-based gas ($SF_6$, $CF_4$, or the like). By appropriately selecting the etching conditions, the end face of the first layer 31*a* has a forward tapered shape.

Figure 4C:
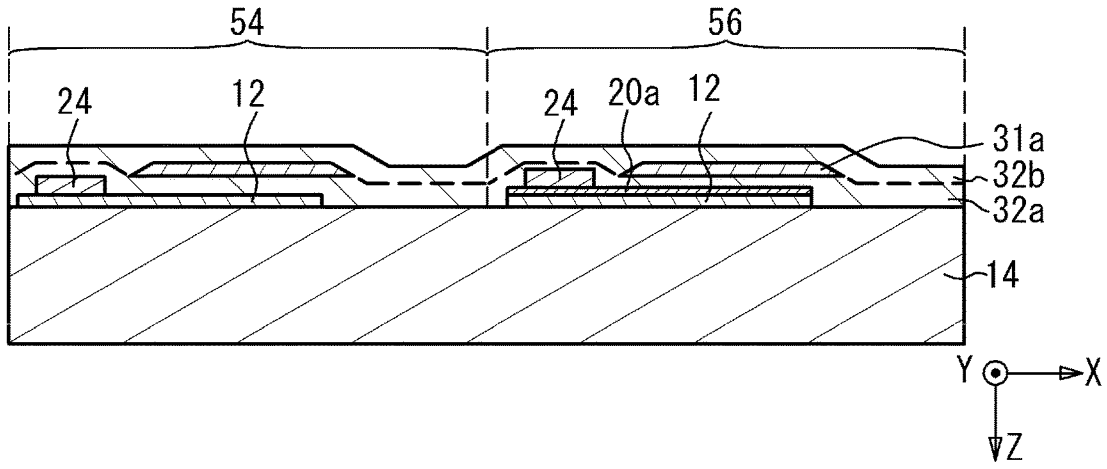

As illustrated in FIG. 4C, a second layer 32*b* is formed on the second layer 32*a* and the first layers 31*a*. The method for forming the second layer 32*b* is the same as the method for forming the second layer 32*a*.

Figure 5A:
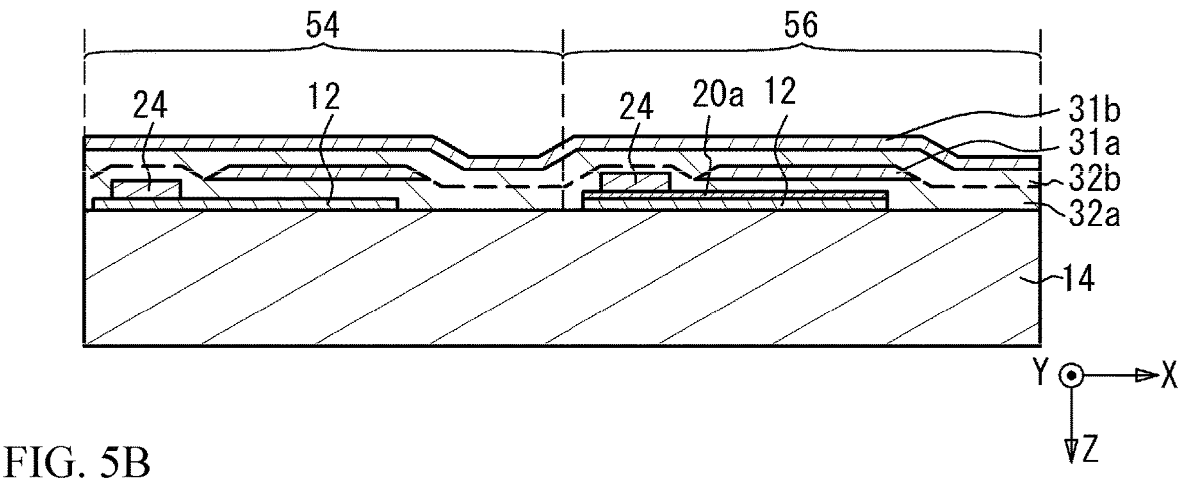
FIG. 5A to FIG. 5C are cross-sectional views (part 3) illustrating the method of manufacturing the piezoelectric thin film resonator in accordance with the first embodiment.
Figure 5B:
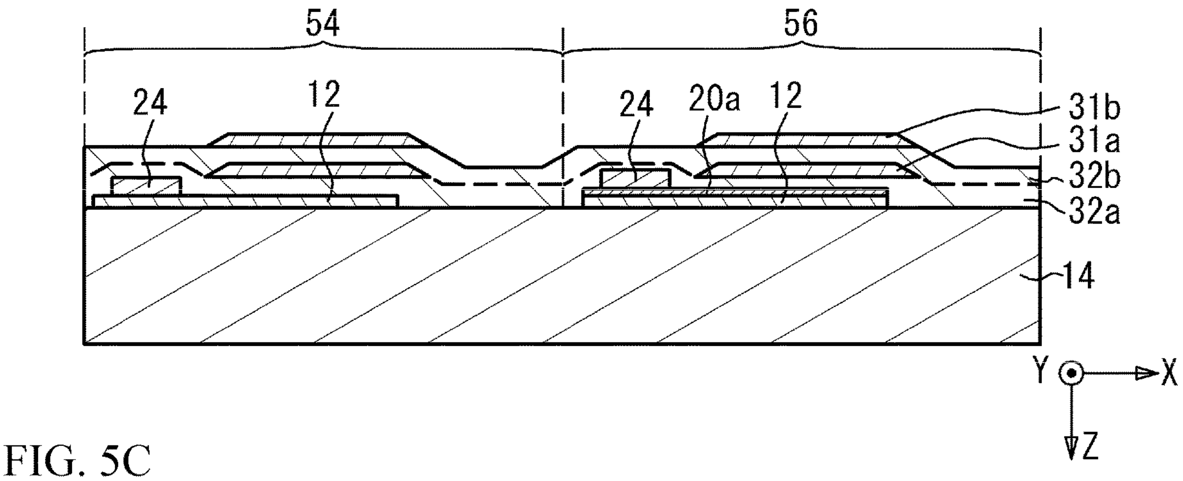
Figure 5C:
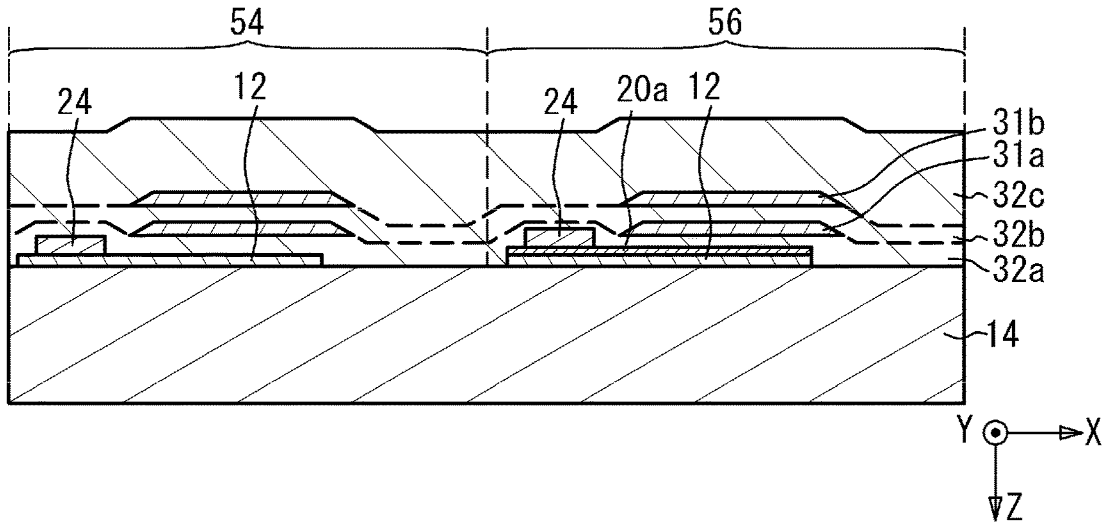

As illustrated in FIG. 5A, first layers 31*b* are formed on the second layer 32*b*. The method for forming the first layers 31*b* is the same as the method for forming the first layers 31*a*. As illustrated in FIG. 5B, the first layers 31*b* are patterned into desired shapes. The method for patterning the first layers 31*b* is the same as the method for patterning the first layers 31*a*. As illustrated in FIG. 5C, a second layer 32*c* is formed on the second layer 32*b* and the first layers 31*b*. The method for forming the second layer 32*c* is the same as the method for forming the second layers 32*a* and 32*b*.

Figure 6A:
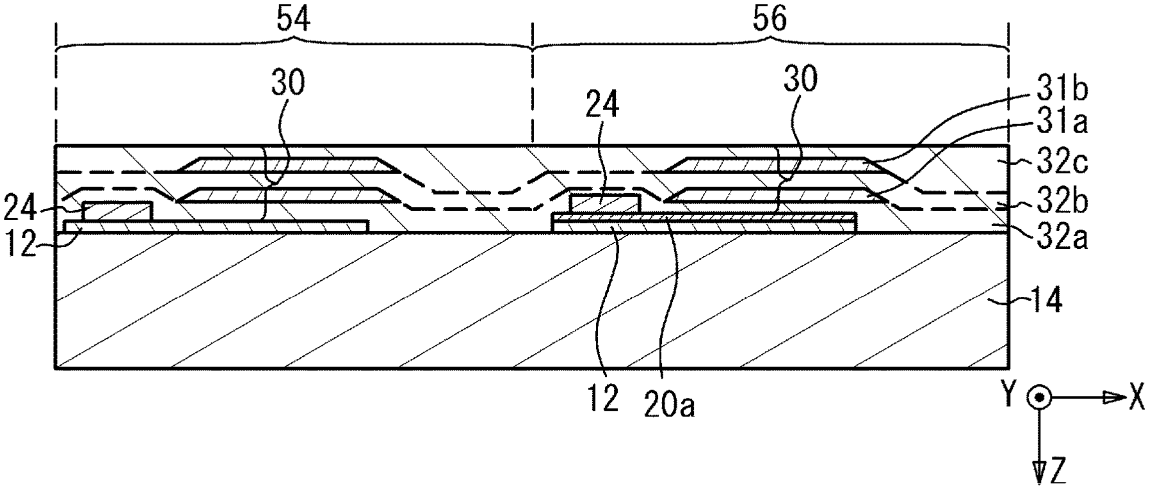
FIG. 6A and FIG. 6B are cross-sectional views (part 4) illustrating the method of manufacturing the piezoelectric thin film resonator in accordance with the first embodiment.
Figure 6B:
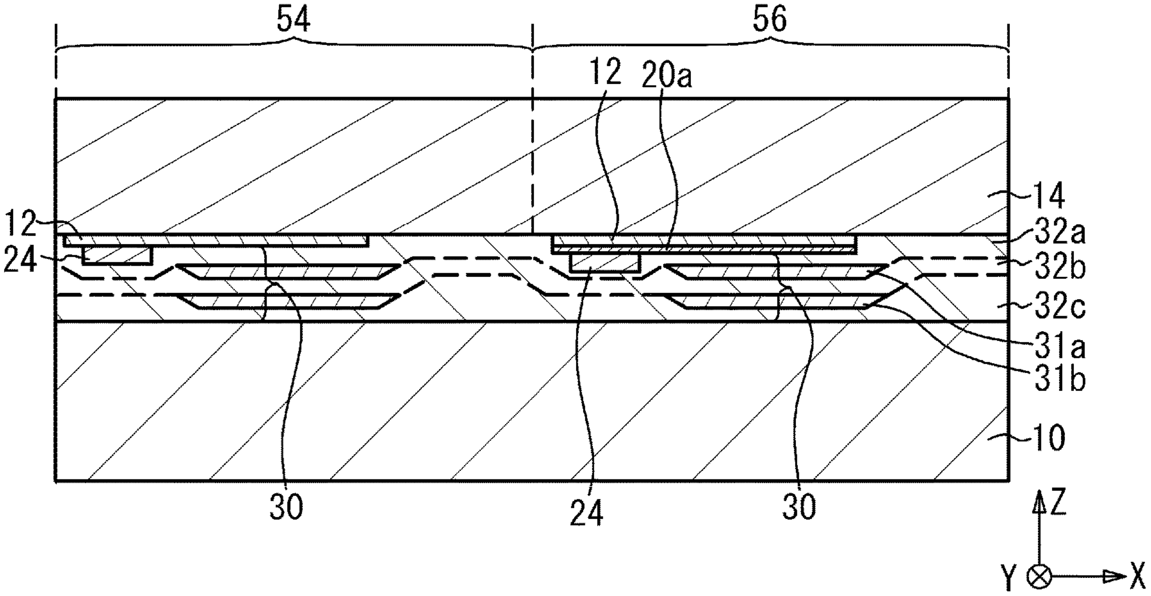

As illustrated in FIG. 6A, the upper surface of the second layer 32*c* is planarized. The second layer 32*c* is planarized by, for example, chemical mechanical polishing (CMP). Thus, the acoustic mirror 30 in which the first layers 31*a* and 31*b* and the second layers 32*a* to 32*c* are alternately stacked is formed. As illustrated in FIG. 6B, the resulting structure is turned upside down, and the lower surface of the second layer 32*c* is bonded to the upper surface of the substrate 10. For example, a surface activation method is used for the bonding. A bonding layer such as a silicon film or an aluminum oxide film may be provided between the substrate 10 and the second layer 32*c*.

Figure 7A:
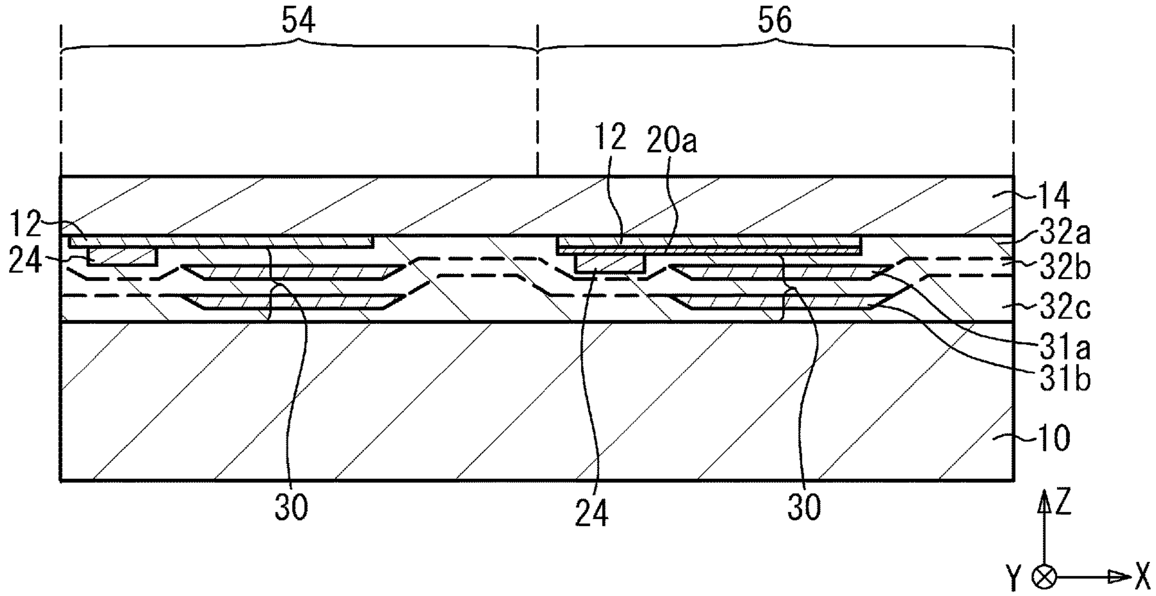
FIG. 7A and FIG. 7B are cross-sectional views (part 5) illustrating the method of manufacturing the piezoelectric thin film resonator in accordance with the first embodiment.

As illustrated in FIG. 7A, the piezoelectric layer 14 is thinned. For example, a grinding method and/or a CMP method is used for the thinning. For example, the piezoelectric layer 14 is made to have a substantially desired thickness by using the grinding method, and the upper surface is planarized using the CMP method. As a result, the upper surface of the piezoelectric layer 14 becomes substantially flat to the extent of manufacturing errors.

Figure 7B:
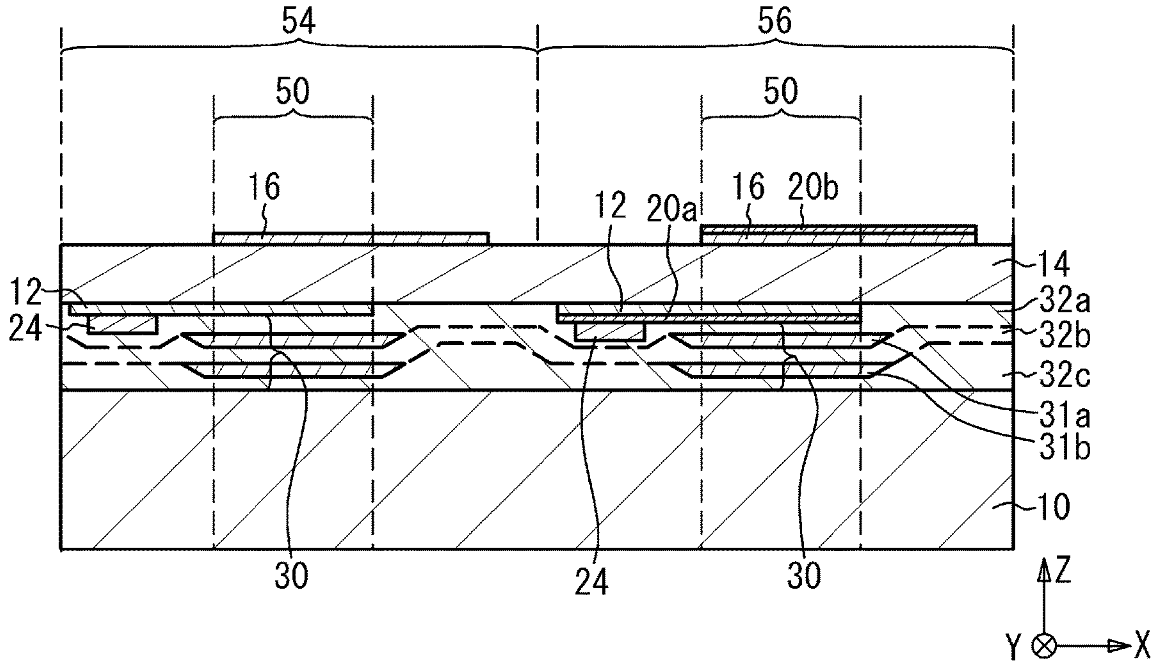

As illustrated in FIG. 7B, the upper electrodes 16 are formed on the piezoelectric layer 14 in the regions 54 and 56, respectively. The additional film 20*b* is formed on the upper electrode 16 in the region 56. The additional film 20*b* is not formed on the upper electrode 16 in the region 54. The upper electrodes 16 and the additional film 20*b* are formed by, for example, sputtering, vacuum evaporation, or CVD. The upper electrodes 16 and the additional film 20*b* are patterned into desired shapes by photolithography and etching. Thus, the resonance regions 50 are formed in the regions 54 and 56, respectively.

Figure 8A:
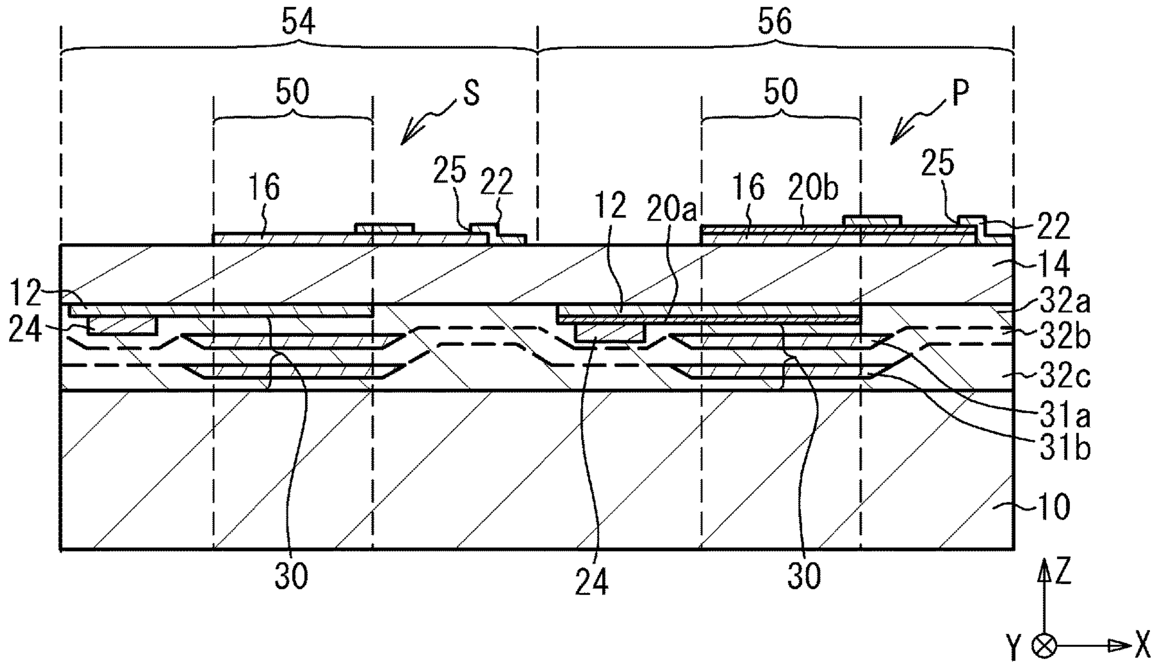
FIG. 8A and FIG. 8B are cross-sectional views (part 6) illustrating the method of manufacturing the piezoelectric thin film resonator in accordance with the first embodiment.

As illustrated in FIG. 8A, the additional film 22 is formed from the periphery of each resonance region 50 to the outside of the resonance region 50. The additional film 22 is formed by, for example, sputtering, vacuum evaporation, or CVD. The additional film 22 is patterned into a desired shape by photolithography and etching. The above processes form the series resonator S and the parallel resonator P in the regions 54 and 56, respectively. The additional film 22 has an aperture 25 to which the upper surface of the upper electrode 16 is exposed.

Figure 8B:
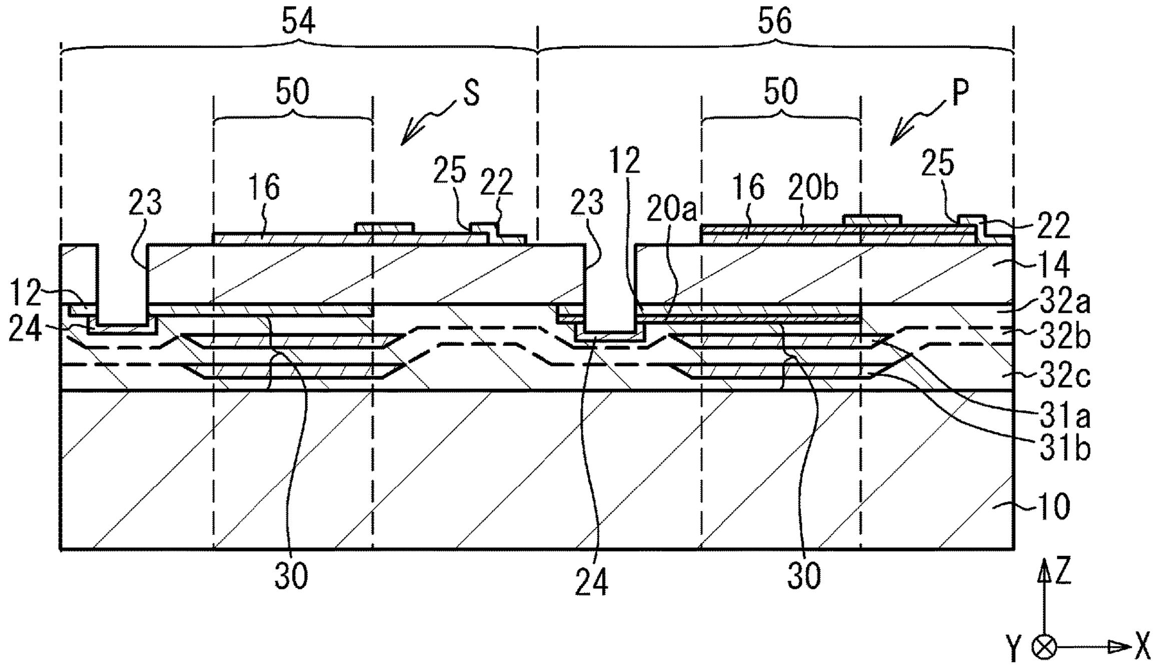

As illustrated in FIG. 8B, a through hole 23 that penetrates through the piezoelectric layer 14 is formed outside each resonance region 50. The through hole 23 penetrates through the lower electrode 12 and the additional film 20*a* to reach the metal layer 24. The through holes 23 are formed by, for example, etching. The metal layer 24 functions as an etching stopper when the through hole 23 is formed. Thereafter, the metal layer 26 electrically connected to the lower electrode 12 and the metal layer 24 is formed in the through hole 23, and the metal layer 28 electrically connected to the upper electrode 16 is formed in the aperture 25. In this manner, the piezoelectric thin film resonator according to the first embodiment is manufactured.

Figure 9A:
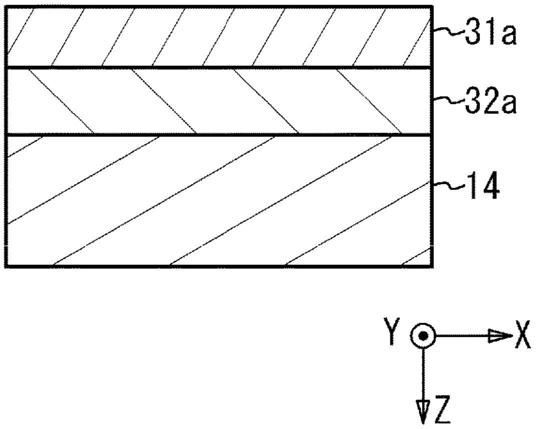
FIG. 9A to FIG. 9C are cross-sectional views illustrating a method of stacking layers of an acoustic mirror in a first comparative example.
Figure 9B:
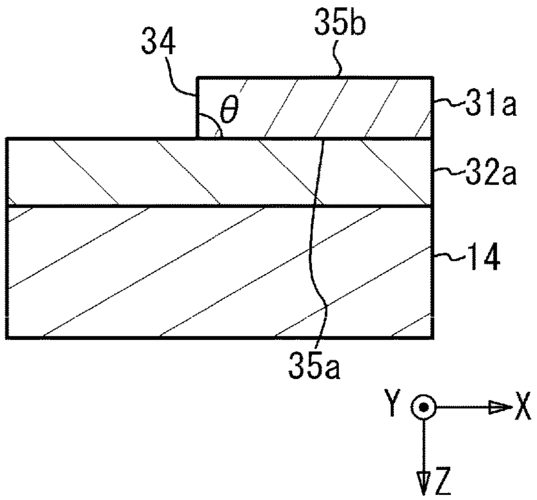
Figure 9C:
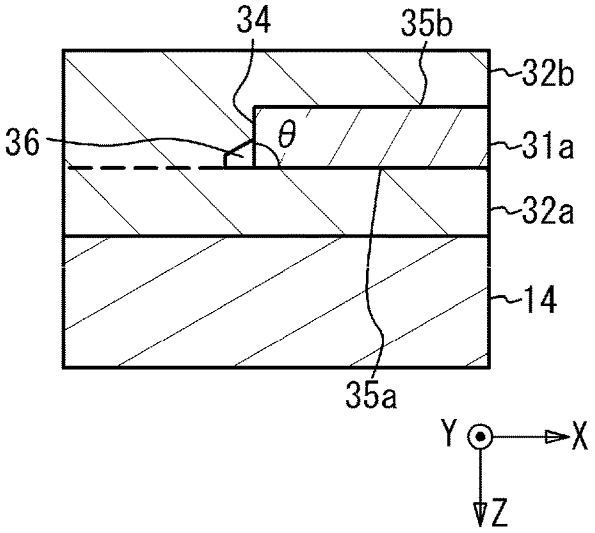

A problem in a case in which the end face 34 of the first layer 31 is not inclined will be described using a first comparative example as an example. FIG. 9A to FIG. 9C are cross-sectional views illustrating a method of stacking layers of the acoustic mirror in accordance with the first comparative example. As illustrated in FIG. 9A, the second layer 32*a* is formed on the piezoelectric layer 14. The first layer 31*a* is formed on the second layer 32*a*. As illustrated in FIG. 9B, the first layer 31*a* is etched using a patterned mask layer as a mask. The angle θ between the end face 34 of the first layer 31*a* and the upper surface 35*a* is 90°. As illustrated in FIG.

9C, after the mask layer is removed, the second layer 32*b* is formed on the second layer 32*a* so as to cover the first layer 31*a*. At this time, a void 36 of the second layer 32*b* is formed outside the end face 34 of the first layer 31*a*.

Figure 9D:
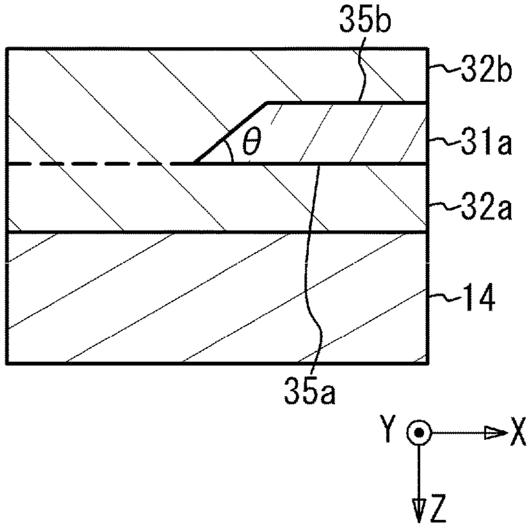
FIG. 9D is a cross-sectional view illustrating a method of stacking layers of the acoustic mirror in the first embodiment.

FIG. 9D is a cross-sectional view illustrating a method of stacking layers the acoustic mirror in the first embodiment. As illustrated in FIG. 9D, in the first embodiment, since the angle θ is smaller than 90°, the coverage of the second layer 32*b* is improved, and the void 36 is less likely to be formed.

In the case that the end faces 34 of the first layers 31*a* and 31*b* are tapered, when the layers of the acoustic mirror 30 is sequentially formed from the lower surface of the piezoelectric layer 14, the end faces 34 have inverse tapered shapes. When the layers of the acoustic mirror 30 is sequentially formed from the upper surface of the substrate 10, the end faces 34 have a forward tapered shape. It may be preferable to sequentially form the layers of the acoustic mirror 30 from the lower surface of the piezoelectric layer 14. For example, when the piezoelectric layer 14 is a piezoelectric substrate, the piezoelectric layer 14 and the substrate 10 are to be bonded to each other. When the acoustic mirror 30 is formed on the substrate 10, and the acoustic mirror 30 and the piezoelectric layer 14 are bonded to each other, the bonding is difficult because there is a level difference due to the lower electrode 12. Therefore, as in the first embodiment, the acoustic mirror 30 is formed on the lower surface of the piezoelectric layer 14, and the acoustic mirror 30 and the substrate 10 are bonded to each other.

First Variation of the First Embodiment

Figure 10A:
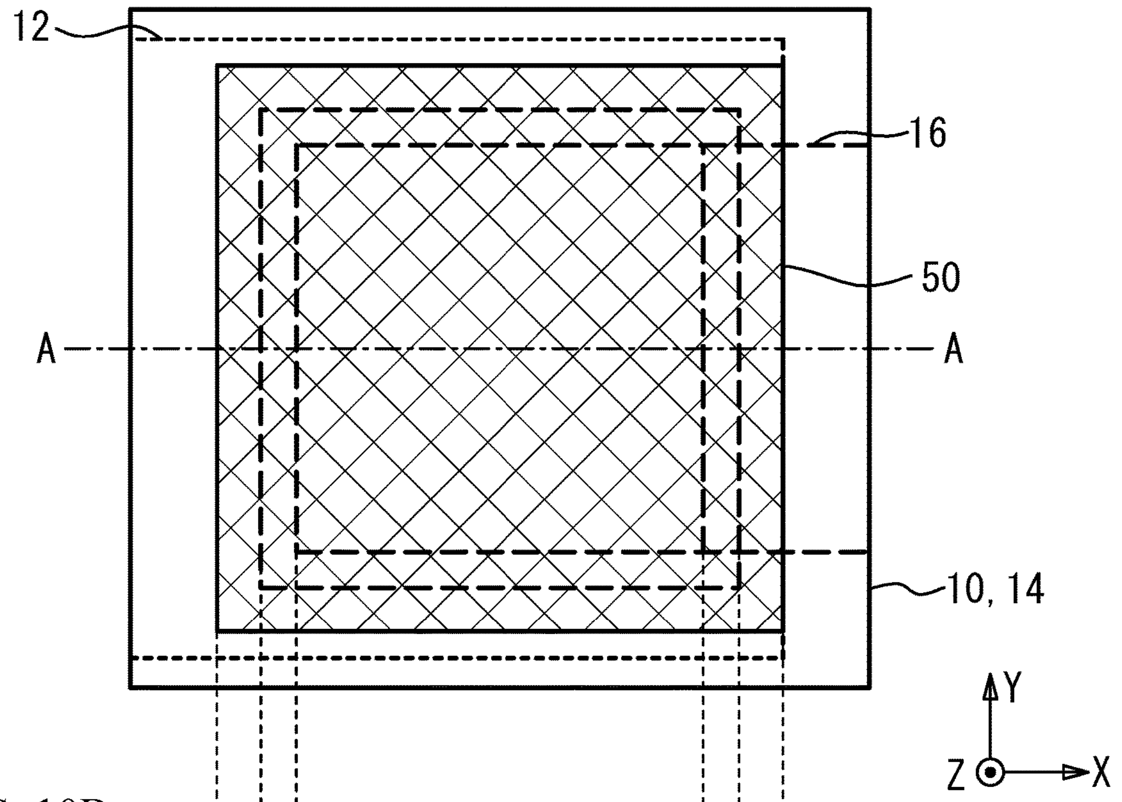
FIG. 10A is a plan view of a piezoelectric thin film resonator in accordance with a first variation of the first embodiment.
Figure 10B:
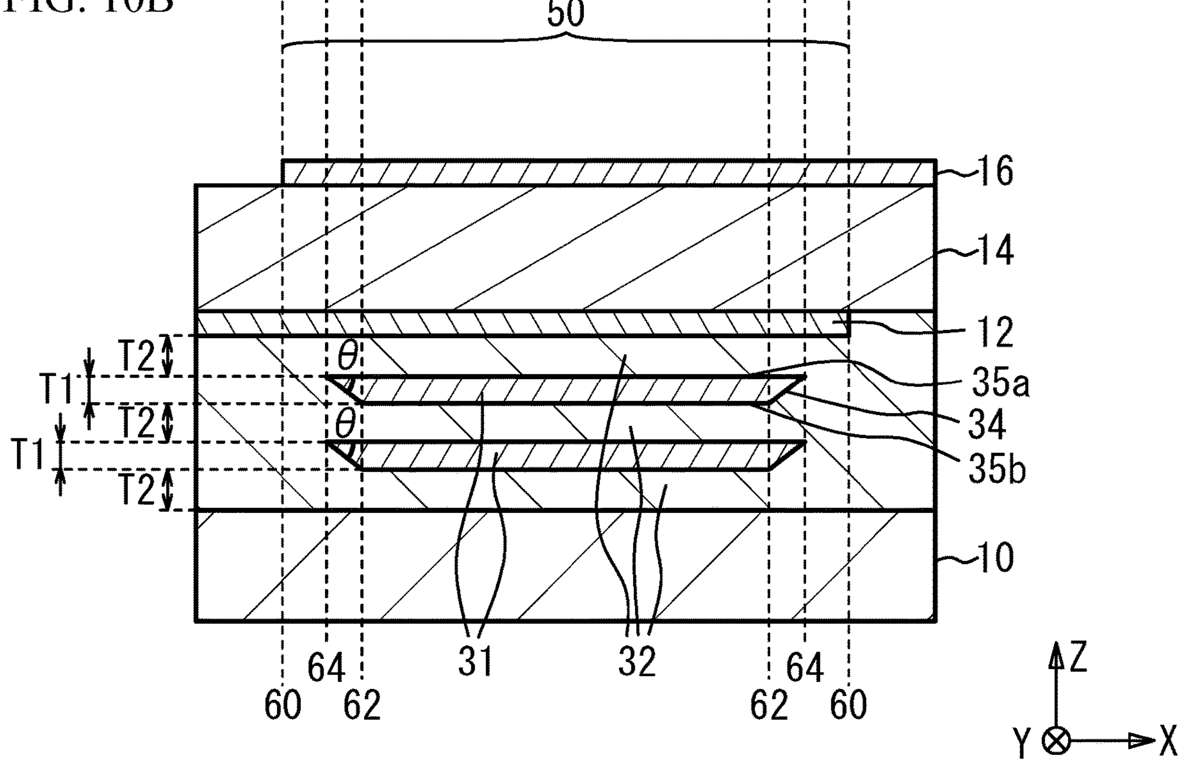
FIG. 10B is a cross-sectional view taken along line A-A in FIG. 10A.

FIG. 10A is a plan view of a piezoelectric thin film resonator in accordance with a first variation of the first embodiment, and FIG. 10B is a cross-sectional view taken along line A-A in FIG. 10A. As illustrated in FIG. 10A and FIG. 10B, the end face 34 of the first layer 31 has an inverse tapered shape. The angle θ between the end face 34 of the first layer 31 and the upper surface 35*a* is, for example, 45° or greater. The planar shape of the acoustic mirror 30 is the same as to or smaller than that of the resonance region 50. The edge 64 of the first layer 31 is located further in than the edge 60, or in the alternative, may be substantially aligned with the edge 60 of the resonance region 50 to the extent of manufacturing errors. Other configurations are the same as those in the first embodiment, and a description thereof will be omitted.

Simulation

A simulation was performed in order to investigate conditions under which characteristics equivalent to or better than those obtained in the case in which the end face 34 of the first layer 31 had a forward tapered shape were obtained in the case in which the end face 34 had an inverse tapered shape. In the simulation, the two-dimensional finite element method in the XY plane was used. The simulation conditions were as follows.

Substrate 10: Silicon (Si) substrate

First layer 31: Tungsten (W) film with a thickness T1 of 152 nm

Figure 11A:
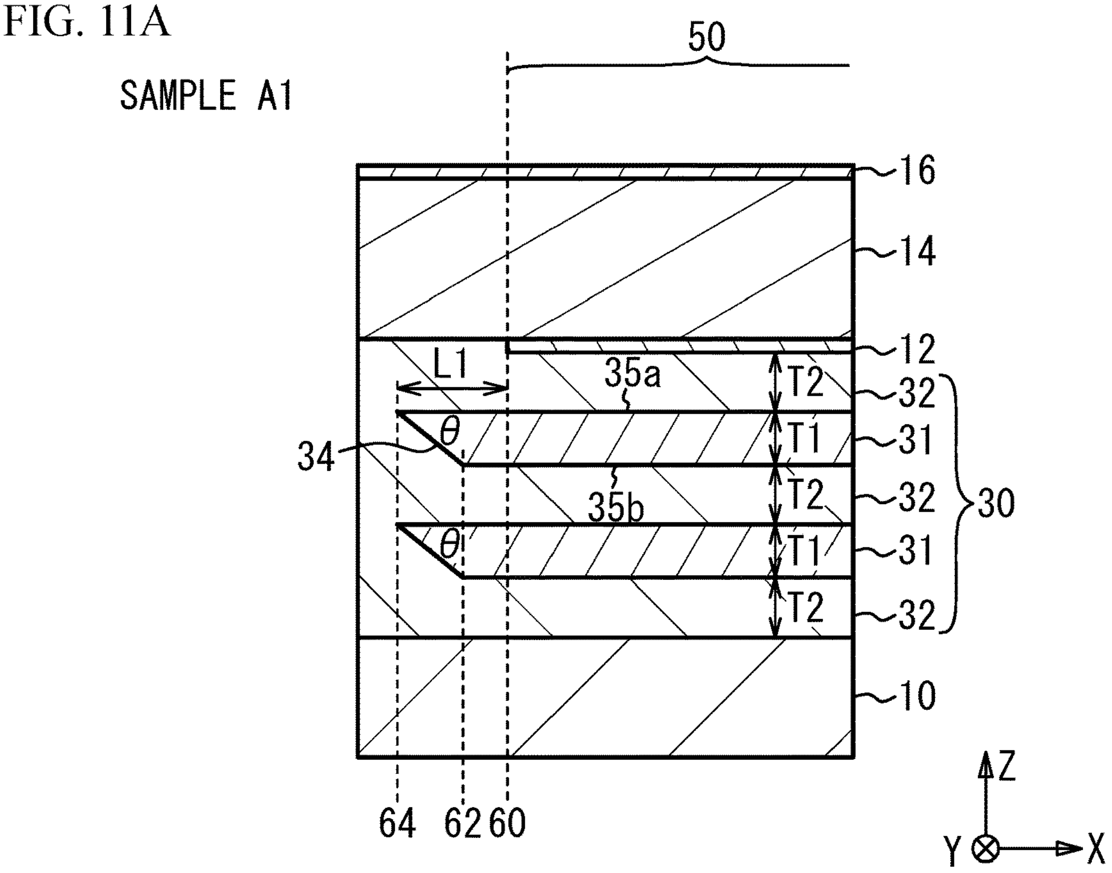
FIG. 11A and FIG. 11B are enlarged cross-sectional views of the vicinities of the end portions of first layers of samples A1 and B1 in the simulation, respectively.
Figure 11B:
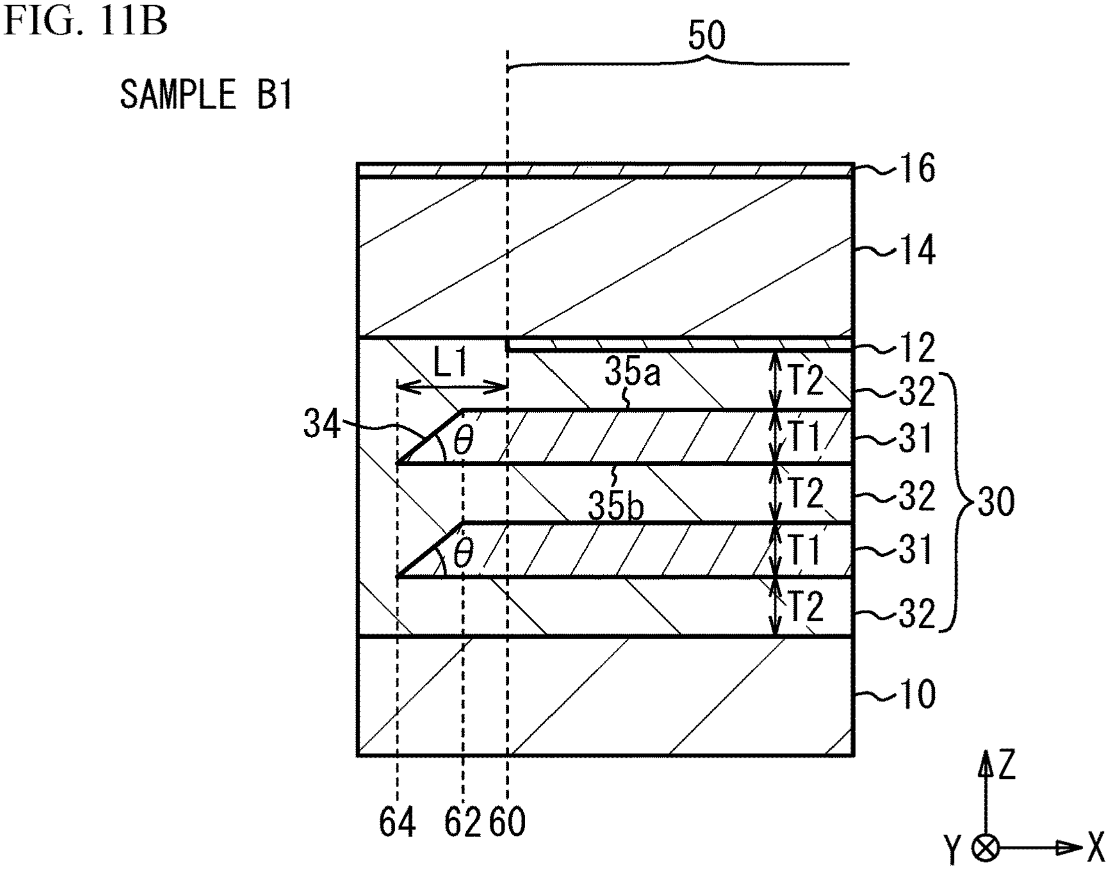

Second layer 32: Silicon oxide ($SiO_2$) film with a thickness T2 of 194 nm Lower electrode 12: Aluminum (Al) film with a thickness of 46 nm Piezoelectric layer 14: Monocrystalline lithium niobate substrate with a thickness of 460 nm Upper electrode 16: Aluminum (Al) film with a thickness of 46 nm Additional film 22: Not provided Width of the resonance region 50 in the X direction: 30 μm FIG. 11A and FIG. 11B are enlarged cross-sectional views of the vicinities of the end portions of the first layers of samples A1 and B1 in the simulation, respectively. As illustrated in FIG. 11A and FIG. 11B, in the samples A1 and B1, the edge 64 of the first layer 31 is further out than the edge 60 of the resonance region 50. The distance L1 between the edges 60 and 64 is 1 μm (1.08λ). Note that λ corresponds to the wavelength of the acoustic wave and is twice the thickness of the piezoelectric layer 14. In the sample A1, the end face 34 of the first layer 31 has an inverse tapered shape, and in the sample B1, the end face 34 of the first layer 31 has a forward tapered shape. In the sample A1, the angle between the end face 34 and the upper surface 35*a* is θ, and in the sample B1, the angle between the end face 34 and the lower surface 35*b* is θ.

Figure 12:
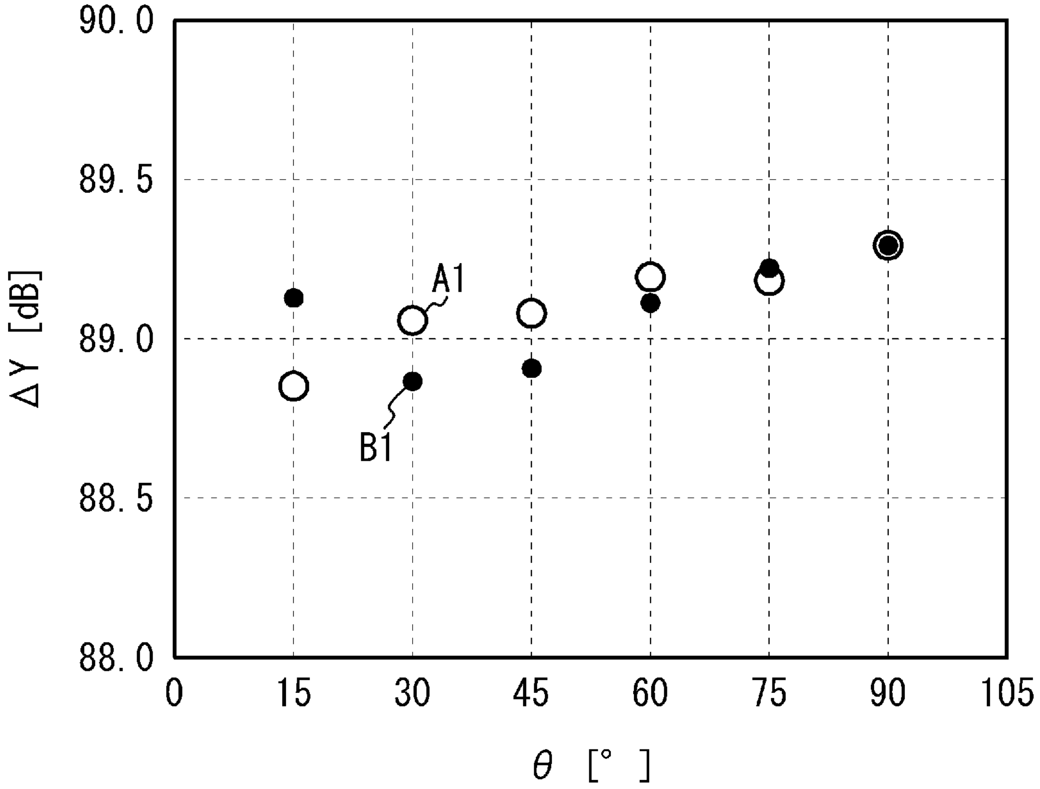
FIG. 12 is a graph of ΔY versus an angle θ in the samples A1 and B1 in the simulation.

FIG. 12 is a graph of ΔY versus the angle θ in the samples A1 and B1 in the simulation. ΔY is the difference between the admittance at the resonant frequency and the admittance at the antiresonant frequency. A larger ΔY indicates better characteristics of the piezoelectric thin film resonator.

As illustrated in FIG. 12, in the samples A1 and B1, even when θ becomes smaller than 90°, the amount of change in ΔY is 0.5 dB or less. The difference between ΔY of the sample A1 and ΔY of the sample B1 is 0.5 dB or less. Thus, in both the samples A1 and B1, ΔY hardly varies even when the angle θ is made to be smaller than 90°.

Figure 13A:
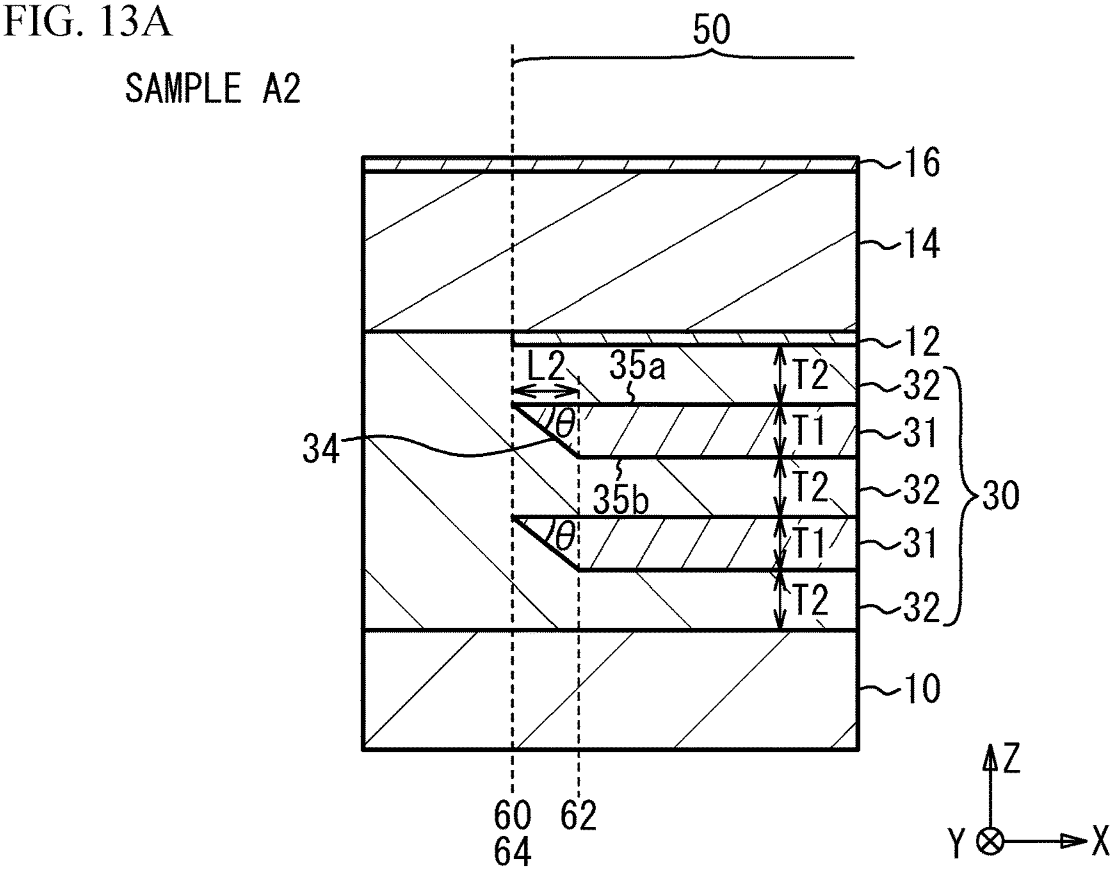
FIG. 13A and FIG. 13B are enlarged cross-sectional views of the vicinities of the end portions of the first layers of samples A2 and B2 in the simulation, respectively.
Figure 13B:
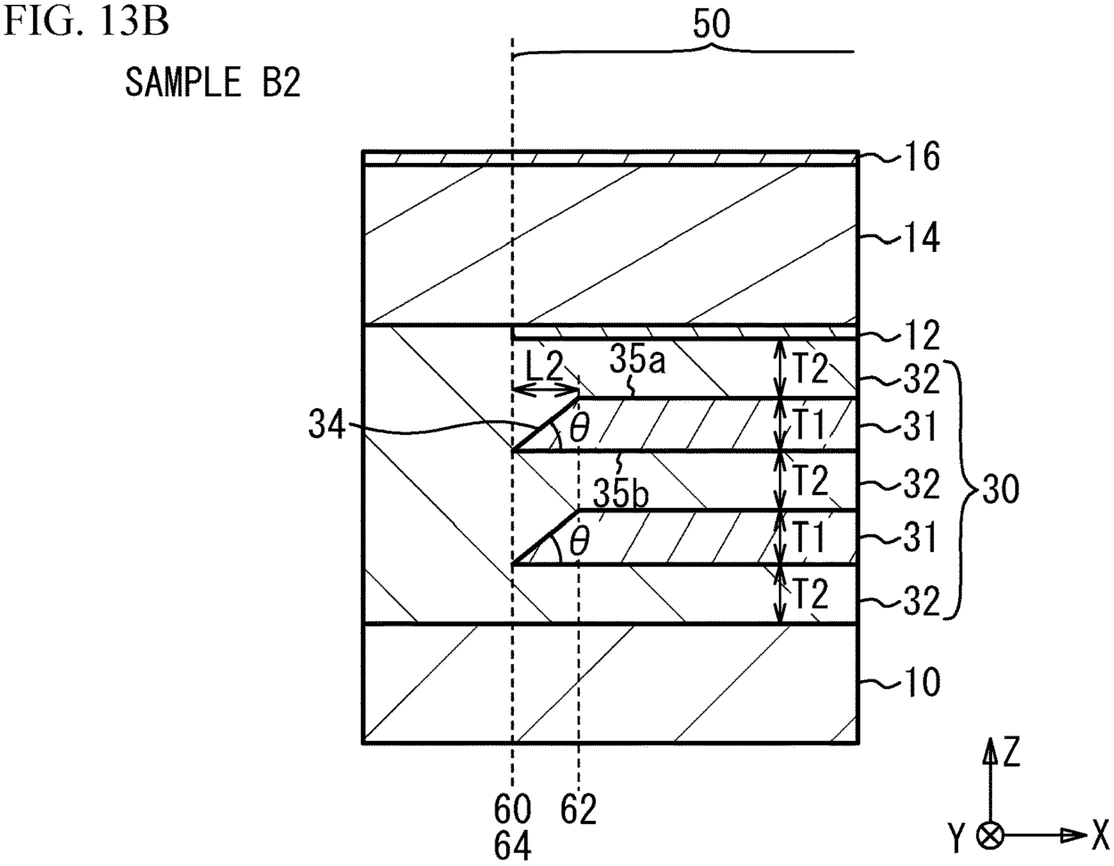

FIG. 13A and FIG. 13B are enlarged cross-sectional views of the vicinities of the end portions of the first layers of samples A2 and B2 in the simulation, respectively. As illustrated in FIG. 13A and FIG. 13B, in the samples A2 and B2, the edge 64 of the first layer 31 is substantially aligned with the edge 60 of the resonance region 50. When the angle θ is 90°, the edge 60 and the position 62 of the contact point between the end surface 34 and the upper surface 35*a* or the lower surface 35*b* are substantially aligned with each other. When the angle θ becomes smaller than 90°, the distance L2 between the edge 60 and the position 62 becomes larger. In the sample A2, the end face 34 of the first layer 31 has an inverse tapered shape, and in the sample B2, the end face 34 has a forward tapered shape.

Figure 14:
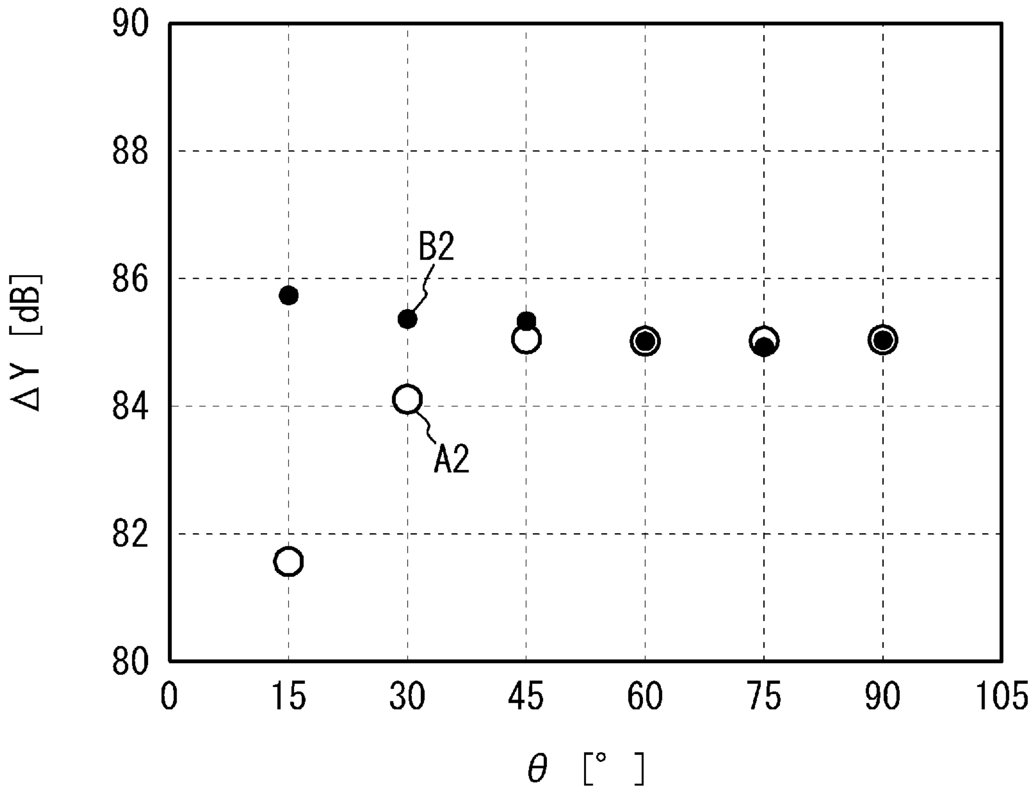
FIG. 14 is a graph of ΔY versus the angle θ in the samples A2 and B2 in the simulation.

FIG. 14 is a graph of ΔY versus the angle θ in the samples A2 and B2 in the simulation. As illustrated in FIG. 14, in the sample B2, even when θ decreases from 90° to 15°, the amount of change in ΔY is 0.5 dB or less. In the range where θ is 60° or greater, ΔY of the sample A2 is substantially the same as ΔY of the sample B2. When θ is 45°, ΔY of the sample A2 is slightly smaller than ΔY of the sample B2. In the range where θ is 30° or less, ΔY of the sample A2 is smaller than ΔY of the sample B2 by 1 dB or greater. Thus, when θ becomes smaller than 45°, ΔY of the sample A2 becomes smaller than ΔY of the sample B2.

Figure 15A:
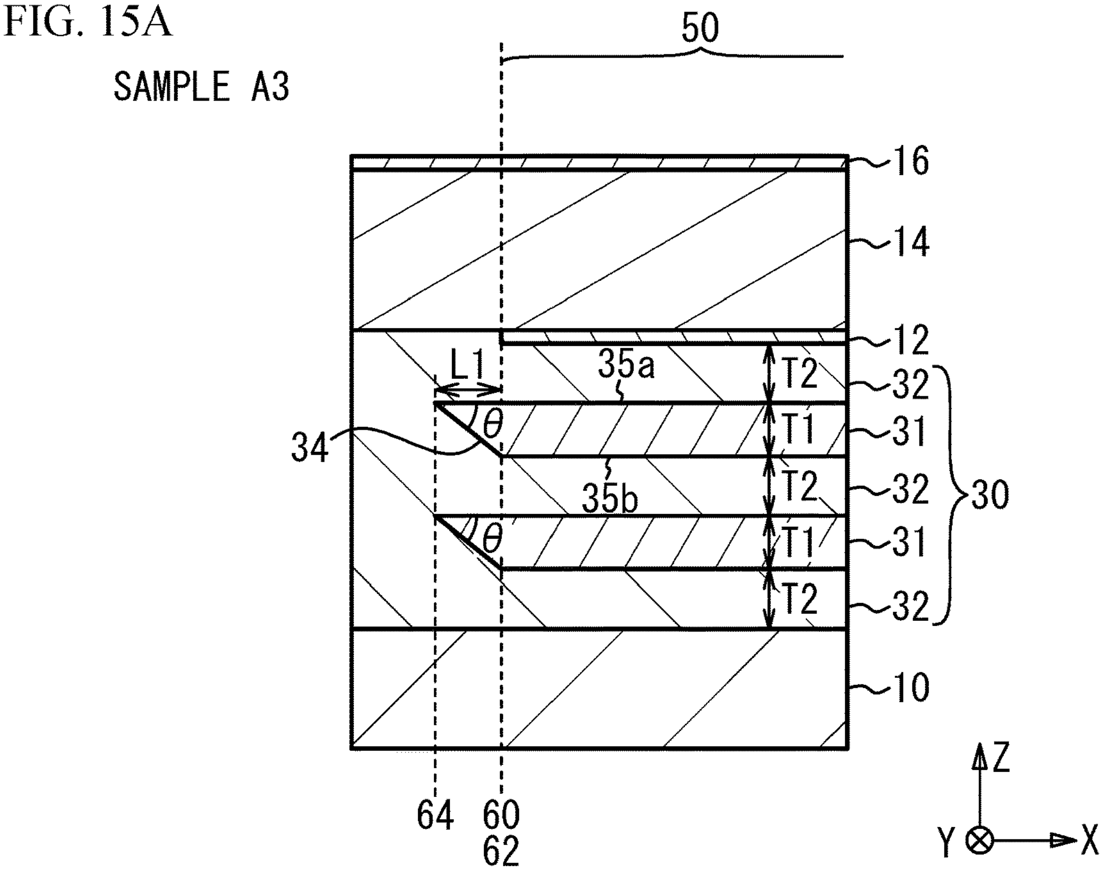
FIG. 15A and FIG. 15B are enlarged cross-sectional views of the vicinities of the end portions of the first layers of samples A3 and B3 in the simulation, respectively.
Figure 15B:
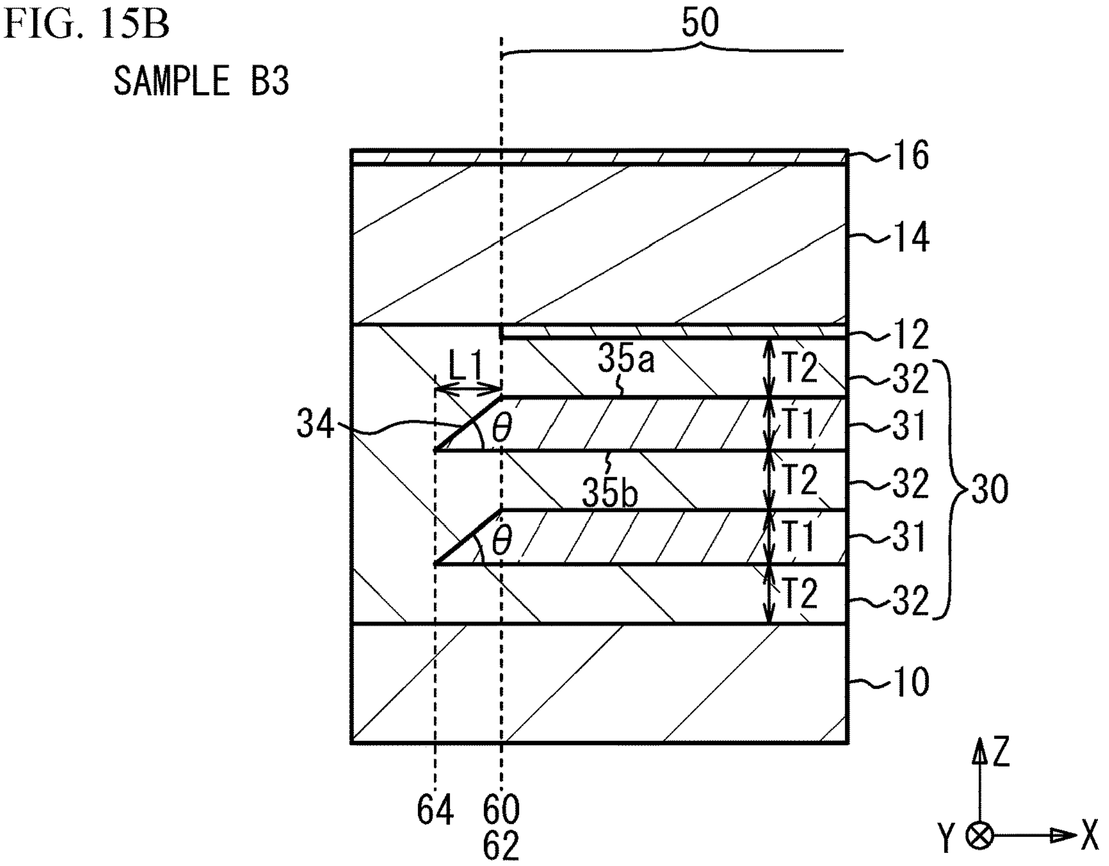

FIG. 15A and FIG. 15B are enlarged cross-sectional views of the vicinities of the end portions of the first layers of samples A3 and B3 in the simulation, respectively. As illustrated in FIG. 15A and FIG. 15B, in the samples A3 and B3, the position 62 of the first layer 31 is substantially aligned with the edge 60 of the resonance region 50. When the angle θ is 90°, the edge 64 and the edge 60 are substantially aligned with each other. When the angle θ becomes smaller than 90°, the distance L1 between the edge 60 and the edge 64 becomes larger. In the sample A3, the end face 34 of the first layer 31 has an inverse tapered shape, and in the sample B3, the end face 34 has a forward tapered shape.

Figure 16:
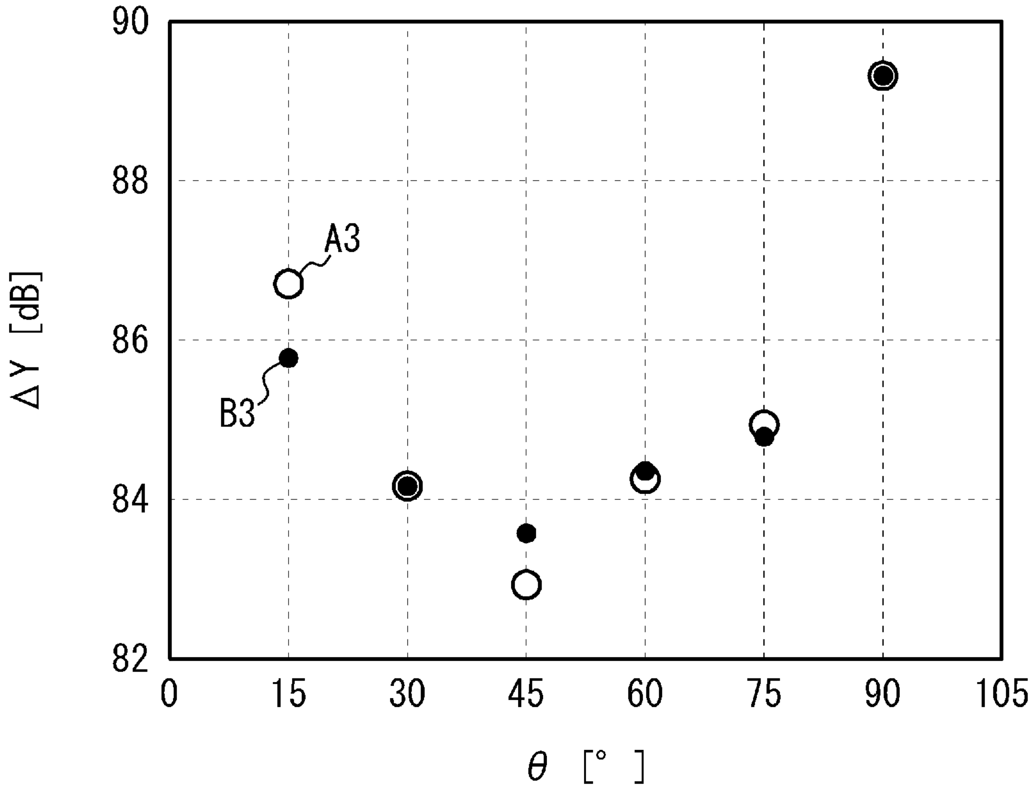
FIG. 16 is a graph of ΔY versus the angle θ in the samples A3 and B3 in the simulation.

FIG. 16 is a graph of ΔY versus the angle θ in the samples A3 and B3 in the simulation. As illustrated in FIG. 16, at each angle θ, the difference between ΔY of the sample A3 and ΔY of the sample B3 is 1 dB or less. In both the samples A3 and B3, ΔY is the smallest when θ is 45°, and ΔY is improved when θ is smaller than 45°. In particular, ΔY when θ is 15° is larger than ΔY when θ is 30° to 75°.

In FIG. 16, as θ decreases, ΔY increases. This suggests that ΔY becomes larger as the edge 64 of the first layer 31 is positioned further out. In FIG. 14, ΔY decreases as θ decreases in the sample A2. This suggests that ΔY becomes larger as the position 62 of the first layer 31 is located further out.

Therefore, in the first embodiment, as in the sample A1 of FIG. 11A to FIG. 12, the edges 64 of one or more first layers 31 are positioned outside the resonance region 50. This configuration allows characteristics similar to those of the sample B1 having the forward tapered end face 34 to be obtained.

When the cross section is observed, the position 62 where the end face 34 and the lower surface 35*b* is in contact with each other in each of the one or more first layers 31 is substantially aligned with the edge 60 of the resonance region 50 or is located outside the resonance region 50. This configuration further improves the characteristics. In consideration of an alignment margin between the position 62 and the edge 60 of the resonance region 50 and manufacturing errors, the distance between the position 62 and the edge 60 is preferably equal to or greater than the thickness T1 of the first layer 31, and more preferably equal to or greater than twice the thickness T1.

In FIG. 16, when θ is 45°, the distance L1 in FIG. 15A corresponds to the thickness T1 of the first layer 31. Therefore, the distance L1 between each of the edges 64 of the one or more first layers 31 and the edge 60 of the resonance region 50 is preferably equal to or greater than the thicknesses T1 of the corresponding first layer 31. The distance L1 is preferably equal to or greater than two times, more preferably equal to or greater than four times, and further preferably equal to or greater than ten times the thickness T1 of the first layer 31. The distance L1 is, for example, equal to or greater than 0.5 times the wavelength of the acoustic wave (twice the thickness of the piezoelectric film 14), and equal to or greater than 1 time the wavelength of the acoustic wave. To reduce the void 36, the angle θ is preferably 85° or less and more preferably 80° or less. To improve the characteristics as illustrated in FIG. 16, the angle θ is preferably 45° or less, more preferably 30° or less, and further preferably 15° or less. When the angle θ is too small, the acoustic mirror 30 becomes large. From this point of view, the angle θ is preferably 5° or greater.

In the first embodiment, as the length L1 increases, the acoustic mirror 30 increases in size. Therefore, the distance L1 is preferably equal to or less than 100 times, more preferably equal to or less than 50 times, the thickness T1 of the first layer 31. This configuration reduces the acoustic mirror 30 in size, and thereby, reduces the piezoelectric thin film resonator in size.

In the first variation of the first embodiment, the edges 64 of the one or more first layers 31 are substantially aligned with the edge 60 of the resonance region 50 or are located within the resonance region 50. This configuration reduces the acoustic mirror 30 in size, and thereby, reduces the piezoelectric thin film resonator in size. As illustrated in FIG. 14, the angle θ between the end face 34 and the upper surface 35*a* is adjusted to be 45° or greater. This configuration improves the characteristics. The angle θ is more preferably 60° or greater, and further preferably 70° or greater. To reduce the void 36, the angle θ is preferably 85° or less and more preferably 80° or less.

In FIG. 14, when θ is 45°, the distance L1 in FIG. 13A is adjusted to be equal to or less than the thickness T1 of the corresponding first layer 31. This configuration improves the characteristics. The distance L1 is more preferably equal to or less than ½ of the thickness T1 of the first layer 31.

The acoustic impedance of the first layer 31 may be smaller than the acoustic impedance of the second layer 32, but is preferably larger than the acoustic impedance of the second layer 32. The acoustic impedance of the first layer 31 is more preferably equal to or greater than 1.5 times, further preferably equal to or greater than 2 times, the acoustic impedance of the second layer 32. Thus, the acoustic mirror 30 reflects the acoustic wave excited in the piezoelectric layer 14.

The piezoelectric layer 14 is a monocrystalline substrate and is provided continuously across a plurality of the resonance regions 50. The surface at the acoustic mirror 30 side of the piezoelectric layer 14 is substantially flat. In this case, as illustrated in FIG. 3C to FIG. 6A, the acoustic mirror 30 is formed in at least a part of the region where the lower electrode 12 is provided of the piezoelectric layer 14. As illustrated in FIG. 6B, the acoustic mirror 30 is bonded onto the substrate 10. As illustrated in FIG. 7B, the upper electrode 16 is formed on the surface opposite from the surface on which the lower electrode 12 is provided of the piezoelectric layer 14. Thus, the void 36 illustrated in FIG. 9C can be reduced by forming the end face 34 of the first layer 31 into an inverse tapered shape.

In the step of forming the acoustic mirror, as illustrated in FIG. 3C, one second layer 32*a* of the second layers 32*a* to 32*c* is formed on the surface on which the lower electrode 12 is provided of the piezoelectric layer 14. As illustrated in FIG. 4A, one first layer 31*a* of one or more first layers 31*a* to 31*b* is formed on the one second layer 32*a*. As illustrated in FIG. 4B, by etching the one first layer 31*a*, the one first layer 31*a* is left in the resonance region 50 and the end face 34 of the one first layer 31*a* is inclined. As illustrated in FIG. 4C, another second layer 32*b* of the second layers 32*a* to 32*c* is formed on the one second layer 32*a* and the one first layer 31*a*. As a result, the first layer 31*a* having the inverse tapered end face 34 can be formed.

In the case that the piezoelectric layer 14 is made of lithium niobate, the piezoelectric layer 14 is, for example, a rotated Y-cut lithium niobate substrate in order to excite the acoustic wave of thickness-shear vibration in the piezoelectric layer 14. In the case that the piezoelectric layer 14 is made of lithium tantalate, the piezoelectric layer 14 is, for example, an X-cut lithium tantalate substrate in order to excite the acoustic wave of thickness-shear vibration in the piezoelectric layer 14.

Second Embodiment

Figure 17A:
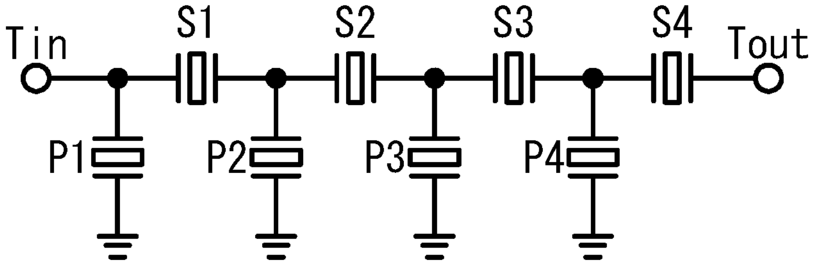
FIG. 17A is a circuit diagram of a filter in accordance with a second embodiment.

A second embodiment is an example of a filter and a duplexer using the piezoelectric thin film resonator in accordance with any one of the first embodiment and the variation thereof. FIG. 17A is a circuit diagram of a filter in accordance with the second embodiment. As illustrated in FIG. 17A, one or more series resonators S1 to S4 are connected in series between an input terminal Tin and an output terminal Tout. One or more parallel resonators P1 to P4 are connected in parallel between the input terminal Tin and the output terminal Tout. The piezoelectric thin film resonator according to any one of the first embodiment and the variation thereof can be used for at least one of the following resonators: one or more series resonators S1 to S4 and one or more parallel resonators P1 to P4. The number of resonators in the ladder-type filter can be set as appropriate.

Figure 17B:
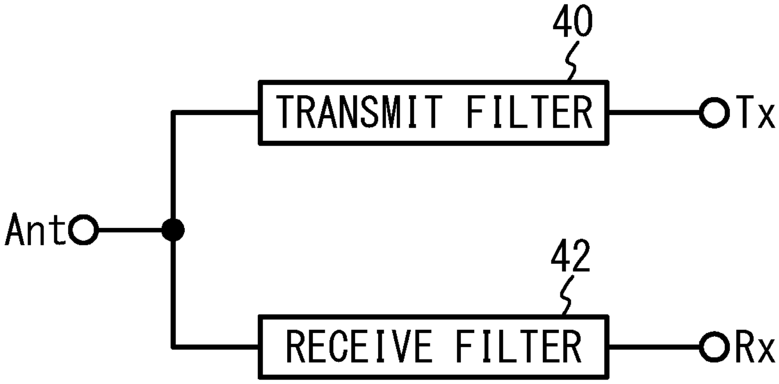
FIG. 17B is a circuit diagram of a duplexer in accordance with a first variation of the second embodiment.

FIG. 17B is a circuit diagram of a duplexer in accordance with a first variation of the second embodiment. As illustrated in FIG. 17B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 or the receive filter 42 may be the filter of the second embodiment.

Although the duplexer has been described as an example of the multiplexer, the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:

a substrate;

a lower electrode provided over the substrate;

a piezoelectric layer provided on the lower electrode;

an upper electrode provided on the piezoelectric layer, the lower electrode and the upper electrode sandwiching at least a part of the piezoelectric layer therebetween to form a resonance region; and an acoustic mirror provided between the substrate and the lower electrode, the acoustic mirror including one or more first layers and a plurality of second layers that are alternately stacked, each of the one or more first layers having an end face inclined such that a first surface, at a side of the lower electrode, of the first layer is larger than a second surface, at a side of the substrate, of the first layer, each of the one or more first layers having an edge positioned outside the resonance region in a plan view as seen from above along a sandwiching direction in which the lower electrode and the upper electrode sandwich the piezoelectric layer, the second layers being made of a material different from a material of the one or more first layers, wherein in a cross section taken along the sandwiching direction, a position at which the end face and the second surface of the first layer is in contact with each other is substantially aligned with an edge of the resonance region in each of the one or more first layers.

2. The piezoelectric thin film resonator according to claim 1, wherein in said cross section, a distance between the edge of the first layer and the edge of the resonance region is equal to or greater than a thickness of the corresponding first layer in each of the one or more first layers.

3. The piezoelectric thin film resonator according to claim 1, wherein an acoustic impedance of each of the one or more first layers is larger than an acoustic impedance of each of the second layers.

4. The piezoelectric thin film resonator according to claim 1, wherein a plurality of the resonance region is provided, and wherein the piezoelectric layer is a monocrystalline substrate, is provided continuously across the plurality of the resonance regions, and has a substantially flat surface at a side of the acoustic mirror.

5. The piezoelectric thin film resonator according to claim 1, wherein:

the end face of the first layer is inclined such that a length of the first surface of the first layer is larger than a length of the second surface of first layer, and an angle between the end face of the first layer and the first surface of the first layer is 30° or less.

6. A method of manufacturing a piezoelectric thin film resonator, the method comprising:

forming an acoustic mirror, in which one or more first layers and a plurality of second layers are alternately stacked, on a first surface of a piezoelectric layer on which a lower electrode has been provided, an end face of each of the one or more first layers being inclined such that a first surface, at a side of the lower electrode, of the first layer is larger than a second surface of the first layer opposite to the first surface, the second layers being made of a material different from a material of the one or more first layers;

bonding the acoustic mirror to a substrate; and forming an upper electrode on a second surface of the piezoelectric layer opposite to the first surface of the piezoelectric layer so that, in a plan view as seen from above along a sandwiching direction in which the lower electrode and the upper electrode sandwich the piezoelectric layer, an edge of each of the one or more first layers is located outside a resonance region where the lower electrode and the upper electrode are opposite to each other across at least a part of the piezoelectric layer, wherein in a cross section taken along the sandwiching direction, a position at which the end face and the second surface of the first layer is in contact with each other is substantially aligned with an edge of the resonance region in each of the one or more first layers.

7. The method according to claim 6, wherein the forming of the acoustic mirror includes:

forming one second layer of the second layers so that the one second layer overlaps at least a part of a region where the lower electrode is provided of the piezoelectric layer, forming one first layer of the one or more first layers on the one second layer, etching the one first layer to leave the one first layer in the resonance region and to incline an end face of the one first layer, and forming another second layer of the second layers on the one second layer and the one first layer.

8. The method according to claim 6, wherein:

the end face of the first layer is inclined such that a length of the first surface of the first layer is larger than a length of the second surface of first layer, and an angle between the end face of the first layer and the first surface of the first layer is 30° or less.

* * * * *